US012593674B2

(12) United States Patent
Lee et al.

(10) Patent No.: US 12,593,674 B2
(45) Date of Patent: Mar. 31, 2026

(54) SEMICONDUCTOR TRANSISTOR DEVICE INCLUDING BACKSIDE CONTACT STRUCTURE VERTICALLY BETWEEN BACKSIDE POWER RAIL AND SOURCE/DRAIN STRUCTURE AND METHOD OF FORMING THEREOF

(71) Applicant: SAMSUNG ELECTRONICS CO., LTD., Suwon-si (KR)

(72) Inventors: Jongjin Lee, Clifton Park, NY (US); Jaejik Baek, Watervliet, NY (US); Myunghoon Jung, Clifton, NY (US); Kang-ill Seo, Springfield, VA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 441 days.

(21) Appl. No.: 18/197,381

(22) Filed: May 15, 2023

(65) Prior Publication Data

US 2024/0203882 A1      Jun. 20, 2024

Related U.S. Application Data

(60) Provisional application No. 63/433,055, filed on Dec. 16, 2022.

(51) Int. Cl.
*H10W 20/41*          (2026.01)
*H10D 30/01*          (2025.01)
(Continued)

(52) U.S. Cl.
CPC ........ *H10W 20/427* (2026.01); *H10D 30/014* (2025.01); *H10D 30/43* (2025.01); (Continued)

(58) Field of Classification Search
CPC .............. H10D 30/6735; H10D 30/43; H10D 30/6729; H01L 23/5286; H10W 20/427; H10W 20/435
See application file for complete search history.

(56) References Cited

U.S. PATENT DOCUMENTS 11,289,402 B2    3/2022  Park et al.
11,380,606 B2    7/2022  Kim et al.
(Continued)

FOREIGN PATENT DOCUMENTS

DE      10 2020 122 151 A1    10/2021
TW          202205460 A       2/2022

OTHER PUBLICATIONS

Communication issued on May 31, 2024 by the European Patent Office in counterpart European Application No. 23214032.7.

*Primary Examiner* — Changhyun Yi
(74) *Attorney, Agent, or Firm* — Myers Bigel, P.A.

(57)          ABSTRACT

Provided is a method of manufacturing an integrated circuit device. The method includes forming a semiconductor device, wherein the semiconductor device has one or more source/drain structures, one or more channel structures and wherein the substrate is on a first side of the semiconductor device. The method also includes forming a back-end-of-line (BEOL) region and forming a bottle-neck shaped backside contact structure in the substrate and in contact with a first source/drain structure of the semiconductor device, wherein the bottle-neck shaped backside contact structure has a first side contacting the first source/drain structure, a second side contacting a backside power rail, and sidewalls extending from the first source/drain structure to the backside power rail; and wherein the backside contact structure has a first region having a positive slope and a second region, adjacent to the first region, having no slope.

20 Claims, 23 Drawing Sheets

200

(51) Int. Cl.
    *H10D 30/43*         (2025.01)
    *H10D 30/67*         (2025.01)
    *H10D 62/10*         (2025.01)

(52) U.S. Cl.
    CPC ..... *H10D 30/6729* (2025.01); *H10D 30/6735*
        (2025.01); *H10D 62/121* (2025.01); *H10W*
                           *20/435* (2026.01)

(56)                 References Cited

U.S. PATENT DOCUMENTS

| | | | |
|---|---|---|---|
| 2021/0343578 A1* | 11/2021 | Chang ................. | H10D 84/038 |
| 2021/0343639 A1 | 11/2021 | Wang et al. | |
| 2021/0351303 A1 | 11/2021 | Ju et al. | |
| 2021/0376094 A1 | 12/2021 | Lin et al. | |
| 2022/0102535 A1* | 3/2022 | Wang ................. | H01L 23/5286 |
| 2022/0238666 A1 | 7/2022 | Kim et al. | |
| 2022/0320329 A1 | 10/2022 | Kim | |
| 2024/0021684 A1 | 1/2024 | Lin et al. | |

\* cited by examiner

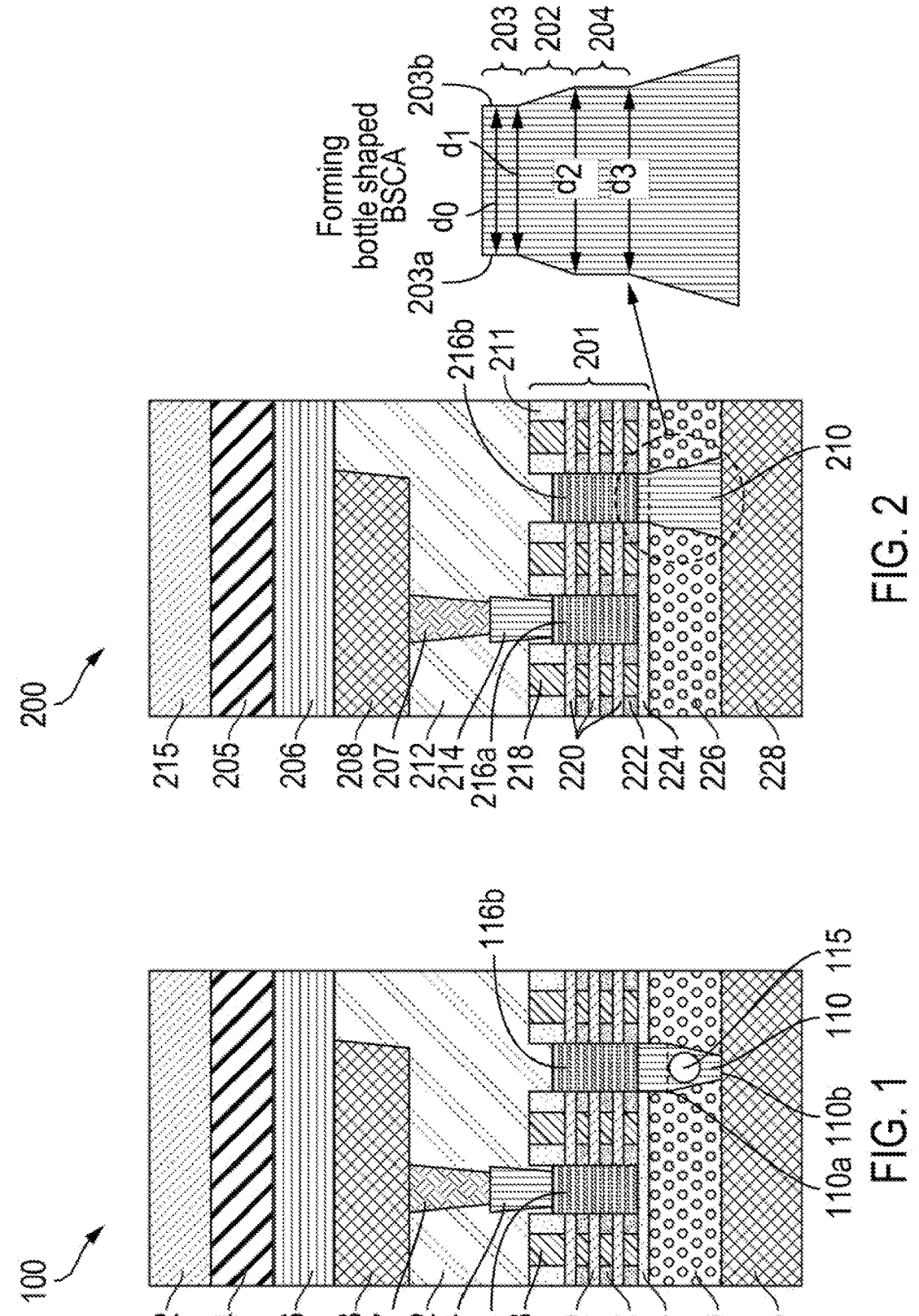

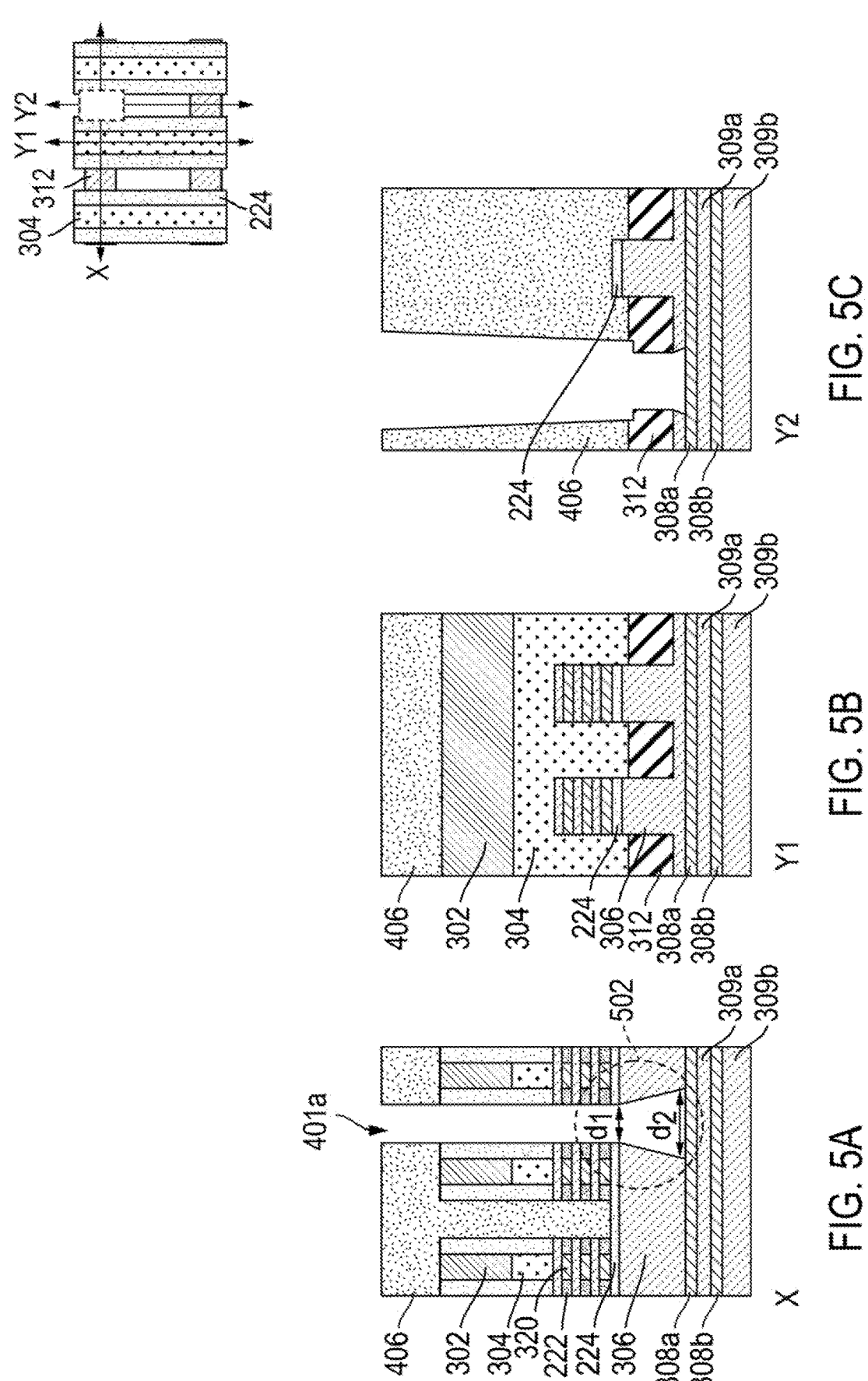

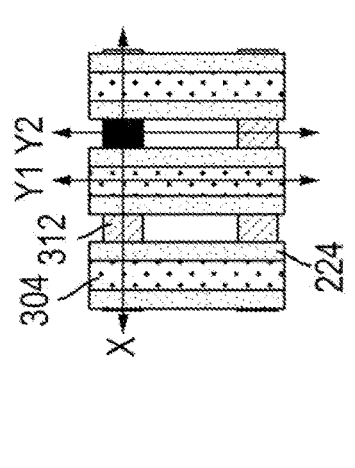
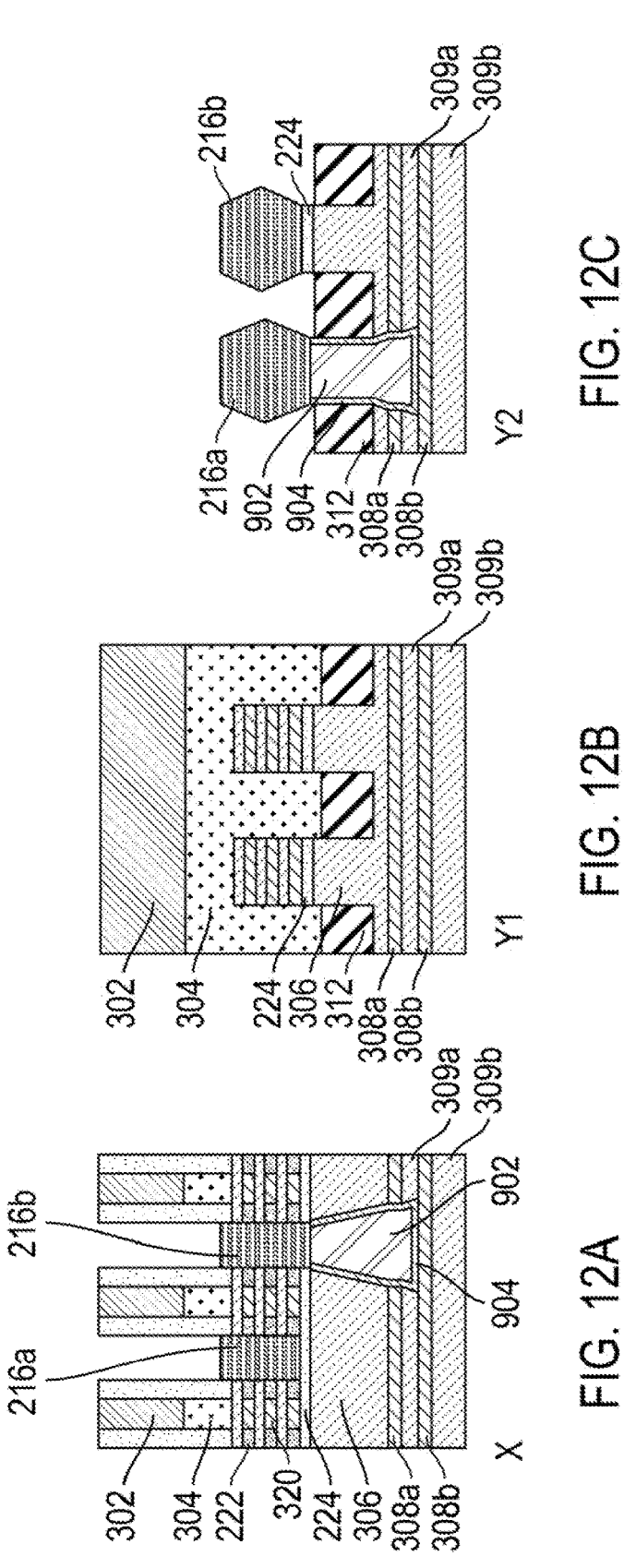
FIG. 12A
FIG. 12B
FIG. 12C

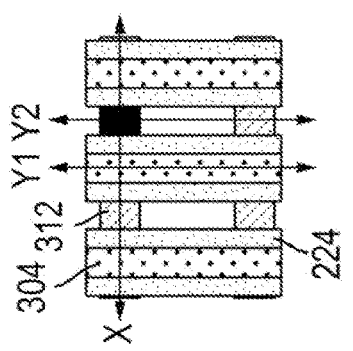
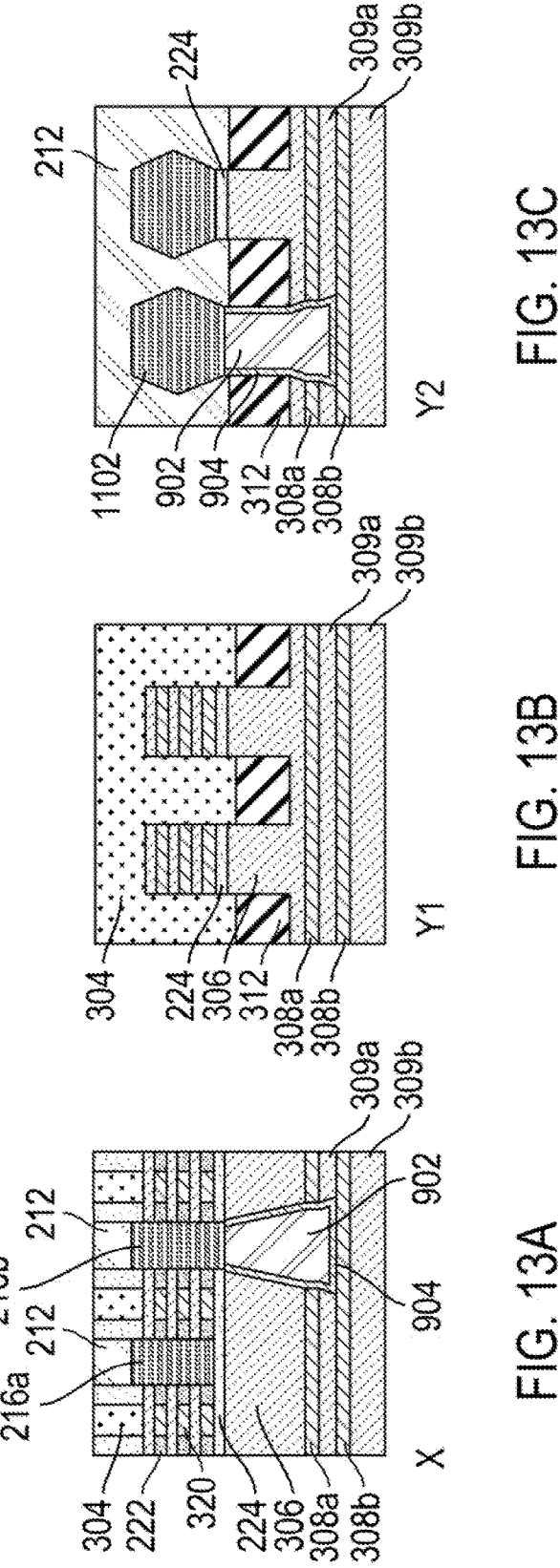
FIG. 13A
FIG. 13B
FIG. 13C

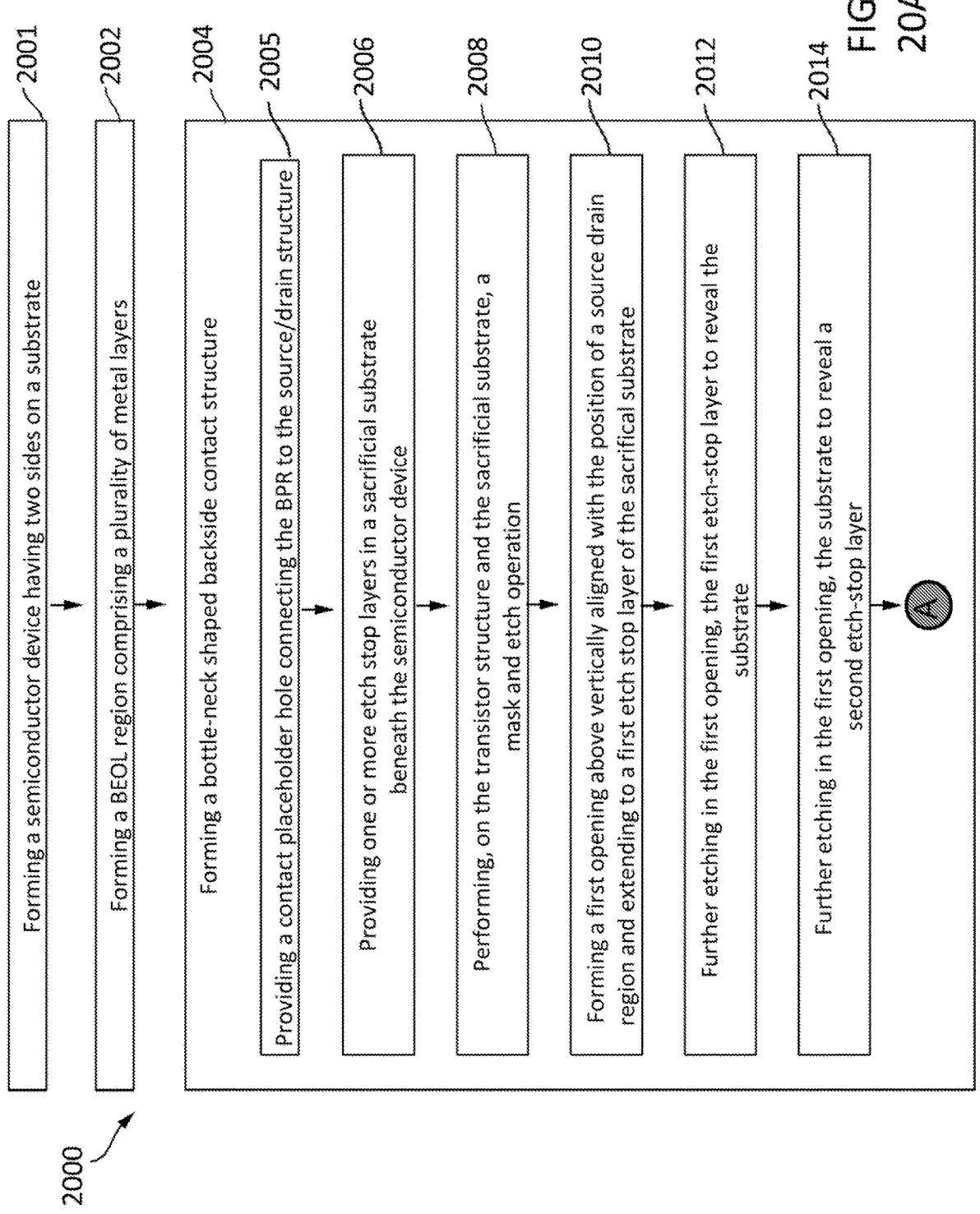

2000

2001   Forming a semiconductor device having two sides on a substrate

2002   Forming a BEOL region comprising a plurality of metal layers

2004   Forming a bottle-neck shaped backside contact structure

2005   Providing a contact placeholder hole connecting the BPR to the source/drain structure 2006   Providing one or more etch stop layers in a sacrificial substrate beneath the semiconductor device 2008   Performing, on the transistor structure and the sacrificial substrate, a mask and etch operation 2010   Forming a first opening above vertically aligned with the position of a source drain region and extending to a first etch stop layer of the sacrificial substrate 2012   Further etching in the first opening, the first etch-stop layer to reveal the substrate 2014   Further etching in the first opening, the substrate to reveal a second etch-stop layer

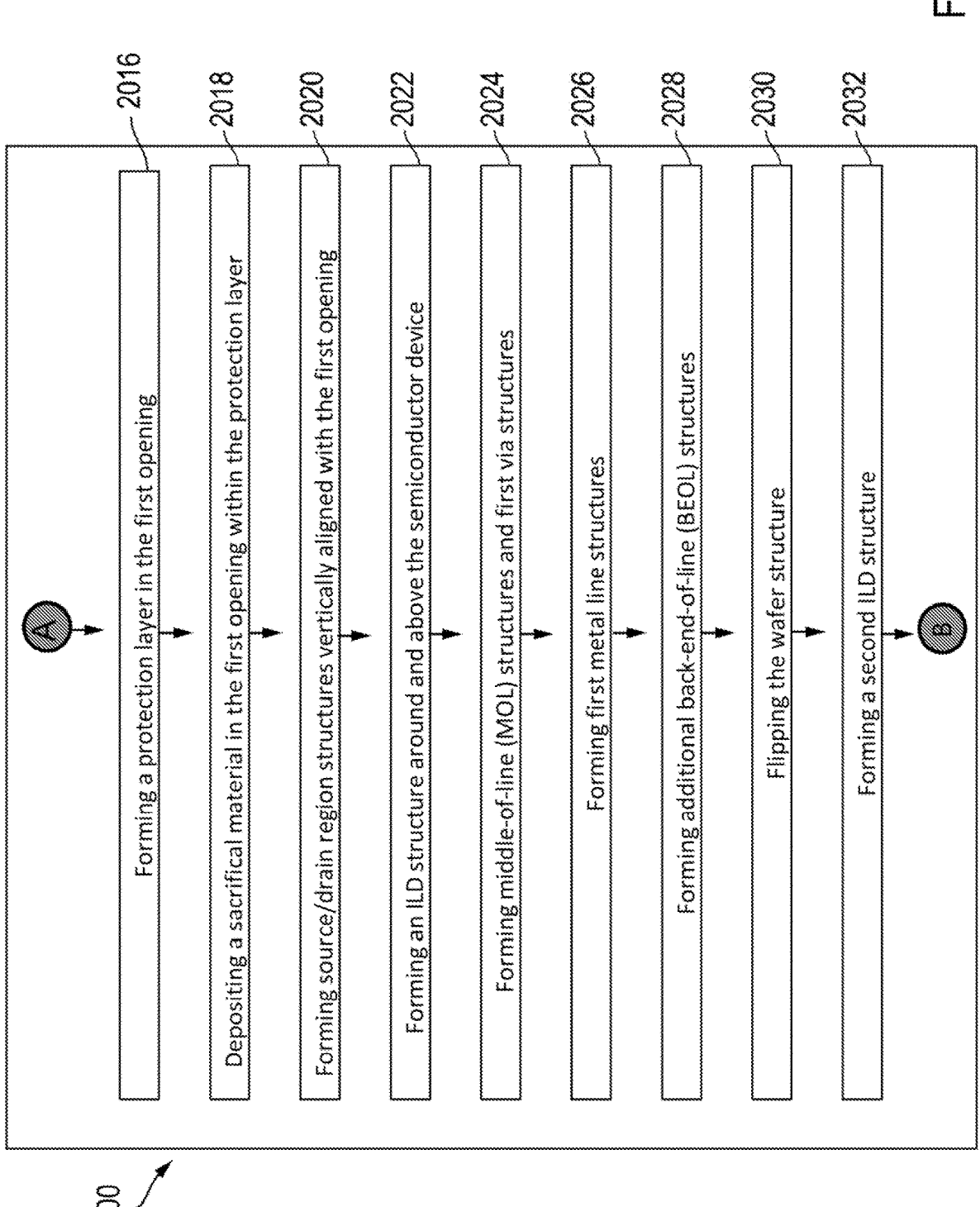

2016 Forming a protection layer in the first opening

2018 Depositing a sacrifical material in the first opening within the protection layer 2020 Forming source/drain region structures vertically aligned with the first opening 2022 Forming an ILD structure around and above the semiconductor device 2024 Forming middle-of-line (MOL) structures and first via structures 2026 Forming first metal line structures 2028 Forming additional back-end-of-line (BEOL) structures 2030 Flipping the wafer structure 2032 Forming a second ILD structure

2034 Planarizing the ILD to a level of the protection layer

2036 Removing the protection layer and the sacrifical material, forming a backside contact void 2038 Forming a bottle-neck shaped backside contact structure in the backside contact void 2040 Forming a backside power rail adjacent to the bottle-neck shaped backside contact structure

SEMICONDUCTOR TRANSISTOR DEVICE INCLUDING BACKSIDE CONTACT STRUCTURE VERTICALLY BETWEEN BACKSIDE POWER RAIL AND SOURCE/DRAIN STRUCTURE AND METHOD OF FORMING THEREOF

CROSS-REFERENCE TO THE RELATED APPLICATION

This application is based on and claims priority from U.S. Provisional Application No. 63/433,055, entitled "Profile Improvement of BSCA in SADBC (Self Aligned Direct Backside Contact) Structure", filed in the United States Patent and Trademark Office on Dec. 16, 2022, the disclosure of which is incorporated herein by reference in all its entirety.

BACKGROUND

1. Field

Apparatuses and methods related to the disclosure relate to the field of semiconductors, and more particularly to integrated circuit devices including backside contact structures.

2. Description of Related Art

Various structures of an integrated circuit device and methods of forming the same have been proposed to increase the integration density thereof.

At least to improve power rail effectiveness and prevent IR drop, a back side power distribution network (BSPDN) has been developed in a semiconductor device structure including a field-effect transistor (FET) such as a nanosheet transistor. Some ways to connect a front side of the nanosheet transistor to a back side thereof have been proposed, including a front via backside power rail (FVBP), a direct backside contact (DBC), etc. Among them DBC is more effective than other contact structures connected to a back side in terms of process capability and dimension limitations. However, in forming a backside contact area (BSCA) sometimes referred to as a backside contact structure, a metal void is generated in a hole or trench where the BSCA is formed due to a tapered BSCA shape. As such, there is a need for profile improvement of the BSCA.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Disclosed herein are devices and methods of fabricating devices intended to address the shortcomings in the art and may provide additional or alternative advantages as well.

(A1) In one embodiment, a device comprising a semiconductor device on a substrate is disclosed. The semiconductor device includes at least two sides, a bottom dielectric isolation, a channel structure, a gate at least partially surrounding the channel structure, a plurality of source/drain structures on opposing sides of the channel structure. The substrate may be on a first side of the semiconductor device, and may include: a backside power rail (BPR) and a backside contact structure. The backside contact structure may be vertically between the BPR and a first source/drain structure, wherein the backside contact structure comprises a first portion contacting the first source/drain structure, having a positive slope and a second portion adjacent to the first portion having no slope, extending from the first portion to a distance further distal from the first source/drain structure. The device also includes one or more metal signal routing layers disposed on an opposite side of the semiconductor device than the substrate.

(A2) The device of (A1), wherein the first portion has a first truncated-cone shaped structure, comprising a first diameter proximate the first source/drain and a second diameter distal from the first source/drain. In some embodiments, the positive slope is defined as the second diameter being greater than the first diameter.

(A3) The device of (A2), wherein the second portion has a conical shaped structure having a third diameter, and wherein no slope is defined as the third diameter being substantially constant and equal to the second diameter.

(A4) The device of (A2), wherein the backside contact structure has a repeating pattern of layers comprised of the first portion being a first layer, the second portion being a second layer, wherein each subsequent truncated-cone shaped structure after the first truncated-cone shaped structure has a wider second diameter than a preceding truncated-cone shaped portion.

(A5) The device of (A1), wherein the backside contact structure is configured to have a bottle-neck-shaped geometry with a mean diameter increase.

(A6) The device of (A1), wherein the backside contact structure includes an initial portion preceding the first portion, wherein the initial portion has a cylindrical shaped structure and wherein the initial portion has side-walls that contact the bottom dielectric isolation.

(A7) The device of (A6), wherein the initial portion has at least two sides, a first side facing the metal signal routing layers and a second side facing the backside power rail, wherein the first side contacts the first source/drain.

(A8) The device of (A1), wherein the first portion has a trapezoid shaped structure from a side-view.

(B1) In a second embodiment, a method of manufacturing an integrated circuit device is disclosed. The method may include forming a semiconductor device having two sides on a substrate, a first side and an opposite side, wherein the semiconductor device has one or more source/drain structures, one or more channel structures and wherein the substrate is on a first side of the semiconductor device. The method also includes forming a back-end-of-line (BEOL) region comprising a plurality of metal layers, disposed on the opposite side of the semiconductor device from the substrate. The method also includes forming a bottle-neck shaped backside contact structure in the substrate and in contact with a first source/drain structure of the semiconductor device. The bottle-neck shaped backside contact structure has a first side contacting the first source/drain structure, a second side contacting a backside power rail, and sidewalls extending from the first source/drain structure to the backside power rail; and wherein the backside contact structure has a first region having a positive slope and a second region, adjacent to the first region, having no slope.

(B2) The method of (B2), wherein forming the bottle-neck shaped backside contact structure includes providing a contact placeholder hole connecting the backside power rail to the first source/drain structure, the contact placeholder hole having: a first portion contacting the first source/drain structure, having a positive slope, a second portion adjacent to the first portion having no slope and extending from the first portion to a distance further distal from the first source/drain.

(B3) The method of (B2), wherein forming the bottle-neck shaped backside contact structure further includes: providing one or more etch stop layers on a sacrificial substrate, performing, on the semiconductor device and the sacrificial substrate, a mask and etch operation; forming a first opening above and vertically aligned with the position of the first source/drain structure and extending to a first etch stop layer of the one or more etch stop layers on the sacrificial substrate.

(B4) The method of (B3), further includes further etching in the first opening, the first etch-stop layer to reveal the sacrificial substrate and further etching in the first opening, the sacrificial substrate to reveal a second etch-stop layer.

(B5) The method of (B4), further comprising: forming a protection layer in the first opening; depositing a sacrificial material in the first opening within the protection layer; and forming the first source/drain region structure vertically aligned with the first opening.

(B6) The method of (B5), further includes forming an ILD structure around and above the semiconductor device, opposite the contact placeholder hole.

(B7) The method of (B6), further includes forming a middle-of-line (MOL) structure and a first via structure thereon through the ILD structure and opposite the contact placeholder hole.

(B8) The method of (B7) further includes forming first metal line structures connected to the first via structures and forming a back-end-of-line (BEOL) structure on the first metal line structures.

(B9) The method of (B8), further comprising: removing the sacrificial substrate including any remaining first etch stop layer and second etch stop layer, exposing the protection layer.

(B10) The method of (B9), further includes forming a second ILD structure on the semiconductor device and surrounding the protection layer, opposite the MOL and BEOL structures, in a space obtained from the removal of the sacrificial substrate.

(B11) The method of (B10), further includes planarizing the second ILD structure to a level of the protection layer and removing the protection layer and the sacrificial material, forming a backside contact void.

(B12) The method of (B12), further includes forming a bottle-neck shaped backside contact structure in the backside contact void and forming the backside power rail (BPR) adjacent to the bottle-neck shaped backside contact structure.

BRIEF DESCRIPTION OF DRAWINGS

Example embodiments of the inventive concept will be more clearly understood from the following detailed description taken in conjunction with the accompanying drawings in which:

FIG. 1 depicts a backside contact area to a semiconductor device, according to an example embodiment of the present disclosure.

FIG. 2 depicts profile improvement of a backside contact area to a semiconductor device, according to an example embodiment of the present disclosure.

FIGS. 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, and 19C depict a method for forming the backside contact area of FIG. 2, according to an example embodiment of the present disclosure.

FIGS. 20A, 20B, and 20C are flowcharts for a process (depicted in FIGS. 3A-19C) for forming a backside contact structure illustrated in FIG. 2, according to an example embodiment of the present disclosure.

DETAILED DESCRIPTION OF EXAMPLE EMBODIMENTS

Figures 3A, 3B, 3C:
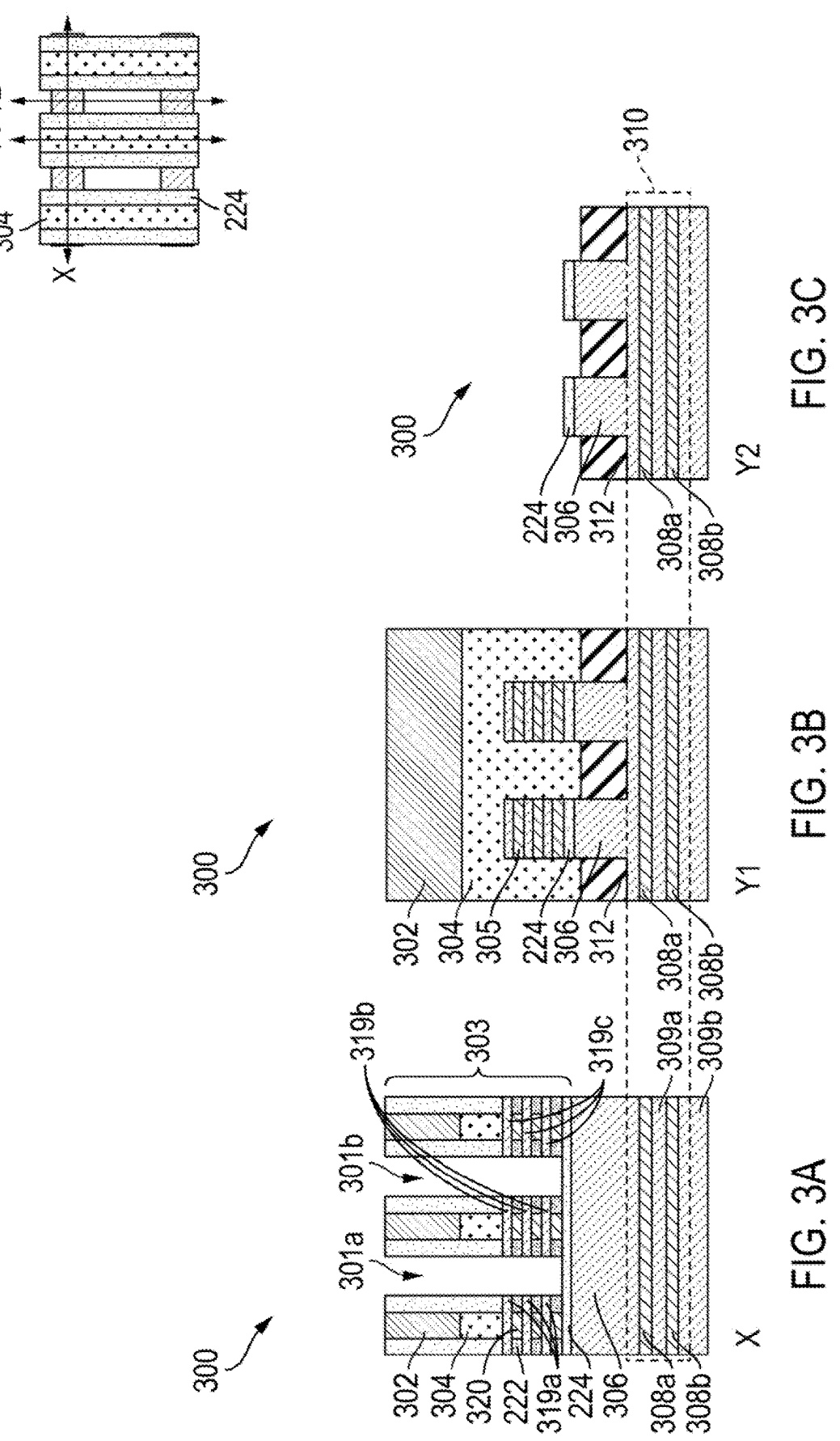

The detailed description set forth below in connection with the appended drawings is intended as a description of some example embodiments of a system and a method for backside contacts to semiconductor devices, provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), formed on one substrate or other appropriate architectures. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

The present disclosure provides a method of fabricating a semiconductor device and the resulting semiconductor device. More specifically, the present disclosure provides profile improvement of a backside CA (BSCA) in a self-aligned direct backside contact (SADBC) structure. One or more embodiments of the disclosure provide an improved BSCA profile for metallization using double SiGe as an etch stop layer.

Referring to FIG. 1, a conventional structure for the backside contact area to a semiconductor device is depicted, according to an example embodiment of the present disclosure. Backside contact area and backside contact structure are used interchangeably herein. The semiconductor device structure 100 is depicted with front-side and backside contacts, the details of which will be provided. The semiconductor device structure 100 may have a suitable thickness.

Before delving into the specifics of the semiconductor device structure 100, it is important to note that the backside contact area 110 is shown with a negative slope. In some embodiments, negative slope is when the diameter of the BSCA 110 nearest the transistor 101 is wider than the diameter of the BSCA 110 furthest from the transistor structure. When the backside contact area has a negative slope, issues such as bad metal filling properties are prevalent. A negative slope could make a void inside during metal filling, which could lead to a disconnect between the contact metal to source/drain 116b. However, when a BSCA (e.g., BSCA 210 shown in FIG. 2) has a positive slope, the limitations associated with a negative slope, as described herein, can be avoided. As used herein, "positive slope" (described in more detail below, in reference to the description for FIG. 2) is when the diameter of the BSCA (e.g., backside contact area 210 shown in FIG. 2) nearest the semiconductor device 201 is smaller than the diameter of the BSCA 210 furthest from the transistor structure.

Referring now to FIG. 1 in greater detail, a semiconductor device structure 100 having front-side and back-side contacts is shown. The semiconductor device structure 100 includes a substrate layer 126, which may comprise a low-K dielectric ILD material such as $SiO_2$. In other embodiments, the substrate layer 126 may be made of any material distinct from $SiO_2$. The substrate layer 126 may have any suitable thickness. For example, the substrate layer may have a thickness in the range from 1000 Angstroms to 2000 Angstroms.

Semiconductor device 101 is disposed on the substrate layer 126, with a first semiconductor side adjacent to substrate layer 126 and a second semiconductor side adjacent to a middle-of-line (MOL) layer 112. The semiconductor device 101 may include any active or passive devices, such as FET transistors, BJTs, diodes, resistors, etc. In the embodiment shown in FIG. 1, semiconductor device 101 is a FET transistor, comprising a first source-drain 116a, a second source-drain 116b separated from the first source-drain 116a in the X direction (perpendicular to the Y direction).

The semiconductor device 101 also includes a channel 120 connecting the first and second source-drains 116a-b in the X direction and a gate structure 118 adjacent to, and at least partially enveloping or surrounding the channel structure 120.

The source-drains may be terminals for the semiconductor device 101 and may be on opposing sides of the channel structure 120. Thus, the illustrated semiconductor device 101 may be a nanosheet FET transistor. In other embodiments, the semiconductor device 101 may be a finFET transistor, nanowire transistor, planar transistor, or any other form of transistor having one or more terminals. Alternatively, semiconductor device 101 may comprise various passive devices such as diodes, resistors, etc. having one or more terminals.

Upon the semiconductor device 101 and opposite the substrate 126 may be a middle-of-line (MOL) layer 112. The MOL layer 112 may comprise a bulk low-K dielectric ILD material such as $SiO_2$. Within the MOL layer 112 may be formed one or more contact plugs 114 that contact a source-drain 116a of semiconductor device 101 from above, as well as one or more contact vias 107, contacting the contact plug 114 from above, and contacting a metal line 108 of the back-end-of-line (BEOL) layers 106 from below, as will be discussed further below. The contact plug 114 may include cobalt, tungsten, molybdenum, ruthenium, a transition metal with barrier metal, or barrier-less metal. In alternative embodiments, contact plug 114 (and associated via 107) may instead provide contact between a metal line 108 of the BEOL layers 106 and the gate 118, providing for signal routing. In this example, the metal line 108 may be a signal routing metal line.

Upon the MOL layer 112 (that is, stacked in the Y direction), and opposite the semiconductor device 101, may be a group of layers collectively called the back-end-of-line (BEOL) layers 106. BEOL layers 106 may comprise a bulk low-K dielectric ILD material such as $SiO_2$. Within the BEOL layers 106 are a series of stacks of metal lines 108 within a series of metal layers (one shown for convenience), the metal lines 108 running parallel to the major surfaces of the substrate and the BEOL layers 106. The metal lines 108 may be adjacent to and contact vias such as via 107 to provide power or signals to semiconductor device 101. The metal lines 108 within BEOL 106 may be connected by vias in a similar manner, but are not shown here for brevity reasons. One of ordinary skill in the art would recognize the connections within BEOL layers 106.

Upon the BEOL layers 106 there may be a bonding oxide 104 which may be a silicon oxide of 3000-5000 Angstroms in thickness.

Upon the bonding oxide may 104 be a carrier wafer 102 which may be a bulk silicon wafer.

Importantly, the substrate 126 also comprises at least one metal line that may serve as a backside power rail (BPR) 128. To connect the backside power rail 128 to the source-drain 116b of the semiconductor device 101, a backside contact area 110 is formed, thus allowing power to flow from power rail 128 to source-drain 116b.

However, some methods of forming the backside contact 110, can cause significant issues with the metal filling within backside contact area 110. For example, contact plug 114 may include cobalt, tungsten, molybdenum, ruthenium, a transition metal with barrier metal, or barrier-less metal. A negative slope from the frontside could cause a void inside the plug metal during deposition. As illustrated in FIG. 1, hole 114 has caused backside contact area 110 to have voids, which may lead to increased resistance in the contact, potentially damaging the functionality of any circuit including semiconductor device 101.

FIG. 2 depicts a profile improvement of the backside contact area 210 to a semiconductor device structure 200, according to an example embodiment of the present disclosure. In some embodiments, the profile improvement to backside contact area 210 is an improvement over the backside contact area 110 discussed in FIG. 1.

Semiconductor device structure 200 may be similar in some ways to semiconductor device structure 100. For example, semiconductor device 101 may have similar properties to semiconductor device 201, carrier wafer 102 may have similar properties to carrier wafer 202, bonding oxide 104 may have similar properties to bonding oxide 205, BEOL layers 106 may have similar properties to BEOL layers 206, metal lines 108 may have similar properties to metal lines 208, MOL 112 may have similar properties to MOL 212, contact plug 114 may have similar properties to contact plug 214, source drain 116a-b may have similar properties to source drain 216a-b, channel 120 may have similar properties to channel 220, interlayer 122 may have similar properties to interlayer 222, a base diffusion isolation or bottom dielectric isolation (BDI) structure 124 may have similar properties to BDI structure 224, substrate 126 may have similar properties to substrate 226, and BPR 128 may have similar properties to BPR 228. In some embodiments, semiconductor device structure 200 has elements and properties that are significantly different from semiconductor device structure 100, including but not limited to backside contact area 210. Other similarities to semiconductor device structure 100 may exist that are not explicitly recited herein.

As used herein, profile improvement of the BSCA 210 may refer to an improvement in the overall structure or geometry of the BSCA 210, allowing for improved metal filling properties. With regards to FIG. 2, it is important to note, among other aspects, that the backside contact structure 210 is shown with a repeating pattern of layers including at least an initial portion 203, one truncated-cone shaped portion 202 (also referred to herein as first portion 202) and one cylindrical-shaped portion 204 (also referred to herein as second portion 204). In some embodiments the method for forming the backside contact area 210 (as described in FIGS. 2A-19C) having at least one truncated-cone shaped portion 202 and one cylindrical shaped portion 204 is, among other features, a significant difference leading to the profile improvement of backside contact structure 210 in FIG. 2. In some embodiments, as will be described in greater detail, the backside contact area 210 includes at least initial portion 203, first portion 202 and second portion 204. The method used to form BSCA 210 is described in greater detail in the description for FIGS. 3A-19C. The improved profile of backside contact area 210 results in an average "positive" slope, which in turn reduces the likelihood of void formation when depositing the metal of backside contact area 210.

Referring now to FIG. 2 in greater detail, a semiconductor device structure 200 having front-side and back-side contacts is shown. The semiconductor device structure 200 includes a substrate layer 226, which may comprise a low-K dielectric ILD material such as $SiO_2$. In other embodiments, the substrate layer 226 may be made of any material distinct from $SiO_2$. The substrate layer 226 may have any suitable thickness. For example, the substrate layer may have a thickness in the range from 1000 Angstroms to 2000 Angstroms.

Semiconductor device 201 is disposed on the substrate layer 226, with a first semiconductor side adjacent to substrate layer 226 and a second semiconductor side adjacent to a middle-of-line (MOL) layer 212. The semiconductor device 201 may be formed in the Y direction, and may include any active or passive devices, such as FET transistors, BJTs, diodes, resistors, etc. In the embodiment shown in FIG. 2, semiconductor device 201 is a FET transistor, comprising a first source-drain 216a, a second source-drain 216b separated from the first source-drain 216a in the X direction (perpendicular to the Y direction).

The semiconductor device 201 also includes a channel 220 connecting the first and second source-drains 116a-b in the X direction and a gate structure 218 adjacent to, and at least partially enveloping or surrounding the channel structure 220. The source-drains may be terminals for the semiconductor device 201 and may be on opposing sides of the channel structure 220. Thus, the illustrated semiconductor device 201 may be a nanosheet transistor. In other embodiments, the semiconductor device 201 may be a FinFET transistor, nanowire transistor, planar transistor, or any other form of transistor having one or more terminals. Alternatively, semiconductor device 201 may comprise various passive devices such as diodes, resistors, etc. having one or more terminals.

Upon the semiconductor device 201 and opposite the substrate 226 may be a middle-of-line (MOL) layer 212. The MOL layer 212 may comprise a bulk low-K dielectric ILD material such as $SiO_2$. Within the MOL layer 212 may be formed one or more contact plugs 214 that contact a source-drain 216a of semiconductor device 201 from above, as well as one or more contact vias 207, contacting the contact plug 214 from above, and contacting a metal line 208 of the back-end-of-line (BEOL) layers 206 from below, as will be discussed further below. The contact plug 214 may include cobalt, tungsten, molybdenum, ruthenium, a transition metal with barrier metal, or barrier-less metal.

Upon the MOL layer 212 (that is, stacked in the Y direction), and opposite the semiconductor device 201, may be a group of layers collectively called the back-end-of-line (BEOL) layers 206. BEOL layers 206 may comprise a bulk low-K dielectric ILD material such as $SiO_2$. Within the BEOL layers 206 are a series of stacks of metal lines 208 within a series of metal layers (one shown for convenience), the metal lines 208 running parallel to the major surfaces of the substrate and the BEOL layers 206. The metal lines 208 may be adjacent to and contact vias such as via 207 to provide power or signals to semiconductor device 201. The metal lines 208 within BEOL 206 may be connected by vias in a similar manner, but are not shown here for brevity reasons. One of ordinary skill in the art would recognize the connections within BEOL layers 206.

Upon the BEOL layers 206 there may be a bonding oxide 205 which may be a silicon oxide of 3000-5000 Angstroms in thickness.

Upon the bonding oxide 205 may be a carrier wafer 215 which may be a bulk silicon wafer.

Importantly, the substrate 226 also comprises at least one metal line that may serve as a backside power rail (BPR) 228. To connect the backside power rail 228 to the source-drain 216b of the semiconductor device 201, a backside contact area 210 (also referred to herein as backside contact structure 210) is formed, thus allowing power to flow from power rail 228 to source-drain 216b.

The backside contact structure 210 may include an initial portion 203, a first portion 202 and a second portion 204. The initial portion 203 may have a cylindrical cross-section and may be in-line with and contacting the source-drain 216b. The two side-walls 203a-b of initial portion 203 are adjacent to and contact the BDI 224. In other embodiments, the initial portion 203 may have a cross-section that is distinct from a cylindrical cross-section. The diameter of the initial portion 203 may be constant throughout the entire region of initial portion 203 and is denoted in FIG. 2 as do. As such, initial portion 203 may have "no slope". "No slope" is defined as the initial diameter, do being substantially constant and equal to the diameter of the portion (s) directly interfacing with it (in this example, first diameter, $d_1$ of first portion 202).

Below the initial portion 203 is a first portion 202, having a positive slope. The first portion 202 has a first diameter, $d_1$ and a second diameter $d_2$. The first diameter $d_1$ may be equal to the diameter of initial portion 203, $d_0$. The backside contact structure 210 has a positive slope when the diameter, $d_1$ of first portion 202, adjacent or nearest to semiconductor device 201 is small and a second diameter, $d_2$ distal from the semiconductor device 201 is larger than diameter $d_1$. With this wide to narrow conical geometry, a positive slope is formed in first portion 202 when the second diameter $d_2$ is wider than first diameter $d_1$. The ratio of wide to narrow proportion or ratio may depend on the diameter of the source/drain 216b. Initial portion 203 may have a same diameter as the diameter of source/drain 216b due to a self-aligned placeholder with the source/drain. First diameter $d_1$ and second diameter $d_2$ of first portion 202 may depend on the diameter do of initial portion 203.

The backside contact structure 210 may also include a second portion 204 adjacent to, directly contacting and beneath the first portion 202. The second portion 204 may have a cylindrical shape having a substantially constant third diameter, $d_3$ throughout the entire second portion 204 and having no slope. "No slope" is defined as the third diameter, $d_3$ being substantially constant and equal to the diameter of the portion (s) directly interfacing with it (in this example, second diameter, $d_2$ of first portion 202). The second portion 204 extends from the first portion 202 to a distance further away from the source/drain 216b. In certain embodiments, the overall BSCA 210 may have a profile composed of any number greater than or equal to 1 of repeated zero slope (e.g., initial portion 203 and second portion 204) and positive slope segments (e.g., first portion 202). The method used to form BSCA 210 is described below and shown in FIGS. 3-19C.

FIGS. 3A-3C depict inner spacer formation on a sacrificial substrate, according to an example embodiment of the present disclosure. Specifically, FIG. 3A represents a cross section taken along the X line of the inset, FIG. 3B represents a view taken along the Y1 cross section of the inset, and FIG. 3C represents a view taken along the Y2 cross section of the inset. This cross-section view is consistent for all FIGS. 3A-19C labeled with "#A", "#B", "#C" in this application where #denotes the Figure number.

Turning to FIG. 3A, semiconductor device 300 includes a first etch-stop layer 308a and a second etch-stop layer 308b which are provided within sacrificial substrate 306. The material of etch-stop layers 308a and 308b may be SiGe. Below SiGe etch-stop layer 308a-b are Si layers 309a-b. More specifically, beneath etch-stop layer 308a is Si layer 309a and beneath etch-stop layer 308b is Si layer 309b. Double-etch stop layer 310 is comprised of first etch stop layer 308a, second etch-stop layer 308b, first Si layer 309a and second Si layer 309b. In another embodiment, a material distinct from SiGe and Si is used for the etch-stop layers 308a-b and 309a-b, respectively. The thickness of each double-etch stop layer may be the same. In some embodiments, the thickness of first etch-stop layer 308a is different from the thickness of second double-etch stop layer 308b. Since the process of FIGS. 3A-19C result in the semiconductor device of FIG. 2 (e.g., semiconductor device structure 200, and more specifically the improved profile of backside contact structure 210), similar numbers are retained, and duplicative descriptions are omitted for brevity.

As a non-limiting first step in forming the BSCA 210, a double-etch stop layer 310 is formed under a BDI layer 224. Trenches are formed down to the BDI layer 224 to separate individual channels 319a and provide space for future source/drains (e.g., source/drains 216a-b) A dummy gate 304 encloses the channel structure 319. Upon the dummy gate 304 is a gate HM layer 302. The gate HM layer 302 may be a nitride-based dielectric (e.g., SiN, AlN, etc.).

Figures 4A, 4B, 4C:
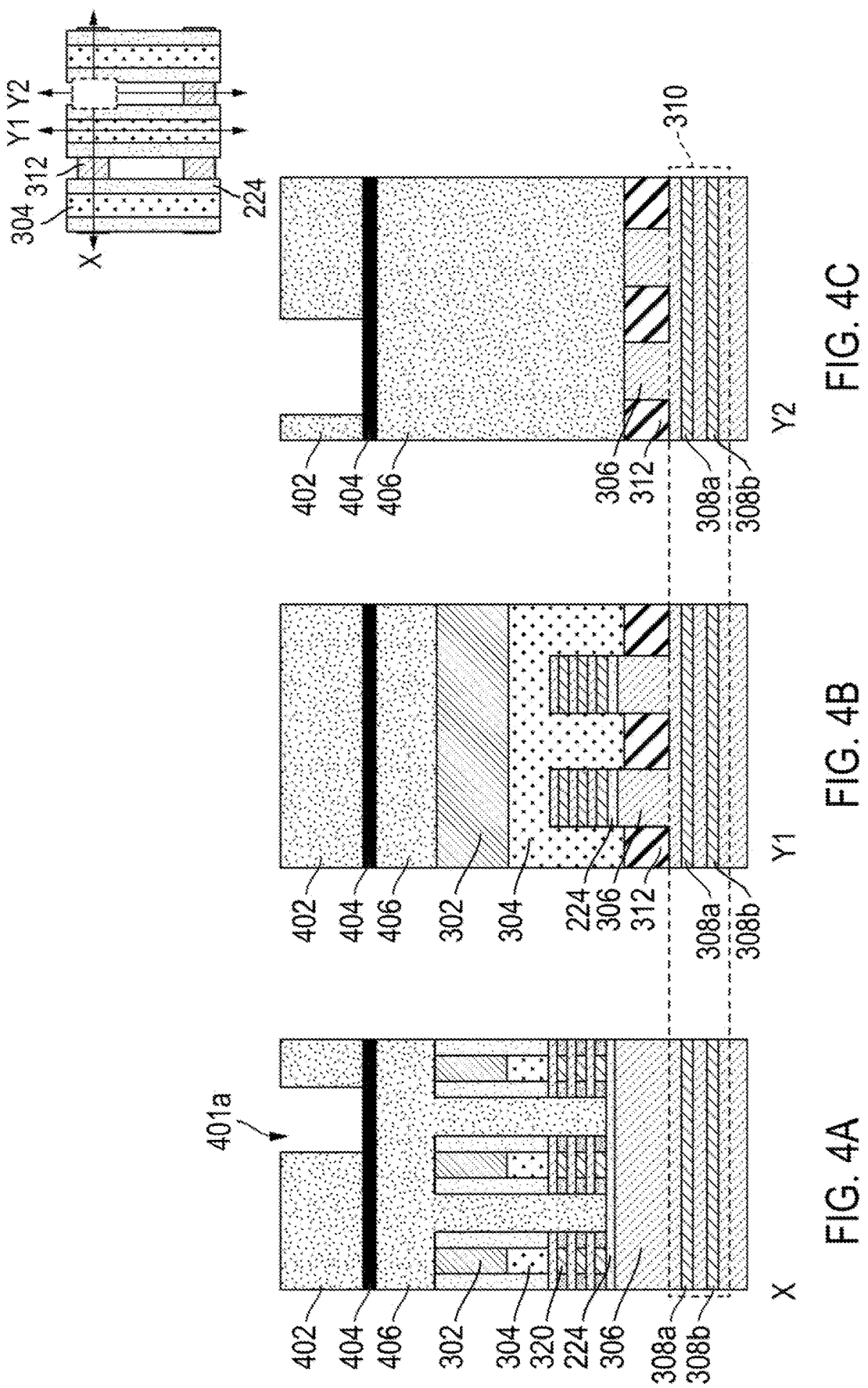

Between the gate isolation layer 222 is a sacrificial SiGe layer 320. At least a portion of sacrificial substrate 306 is positioned beneath BDI 224. In some embodiments, the entire portion of sacrificial substrate 306 is positioned beneath BDI 224. Importantly, inner spacers 301a and 301b are formed on the BDI layer 224. A shallow trench isolation layer 312 is adjacent to the FIGS. 4A-4C depict a photolithography step, according to an example embodiment of the present disclosure. More specifically, on intermediate structure 303 shown in FIG. 3, including inner spacers 301a, 301b and channel structures 319a-f, a photolithography and masking operation is performed. A first organic planarization layer (OPL) structure 406 is formed over the intermediate structure 303, upon which a SiARC layer 404 is formed. The SiARC layer 404 may be a Si-based anti-reflection coating, including carbon. Over the SiARC layer 404 a photoresist layer 402 is formed. The photoresist layer 402 has a first opening 401a above an area between the channel structure 319a and 319b.

FIGS. 5A-5C depict forming a first truncated-cone shape portion of the backside contact area 210 of FIG. 2, according to an example embodiment of the present disclosure. It is important to note that, since backside contact area 210 of FIG. 2 has not formed yet, the intermediate structure that will be described in FIGS. 5A-7C, including first portion 502 (first depicted in FIG. 5A), second portion 504 (first depicted in FIG. 6A) and third portion 506 (first depicted in FIG. 7A) will be referred to herein as contact placeholder hole 501. More specifically, FIGS. 5A-5C depict further top-down etching in the first opening 401a (shown in FIG. 4A) to the first etch stop layer 308a, penetrating the BDI structure 224 and revealing a portion of sacrificial substrate 306a. This top-down etching method also results in exposing a first side of the first-etch stop layer 308a facing the BDI structure 224. Significant to note is that this etching method also results in a first truncated-cone shaped portion 502, since the etchant may be highly selective for the material of substrate layer 306, front-end-of-line (FEOL) structures are not significantly etched. The first truncated-cone shaped portion has a positive slope, as discussed previously in reference to FIG. 2. The first diameter, $d_1$ of the first truncated-cone shaped portion 502, is smaller than the second diameter, $d_2$ of the first truncated-cone shaped portion. The region from $d_1$ to $d_2$ may form what is referred to herein as the first portion 502 or first truncated-cone shaped portion 502. Once the first truncated-cone shaped portion 502 is formed, the photoresist layer 402 and SiARC layer 404 may be removed, leaving the OPL structure 406 formed over the intermediate structure 303. In other embodiments, an alternative method that produces similar results as the photoresist layer 402 and SiARC layer 404 may be used.

Figures 6A, 6B, 6C:
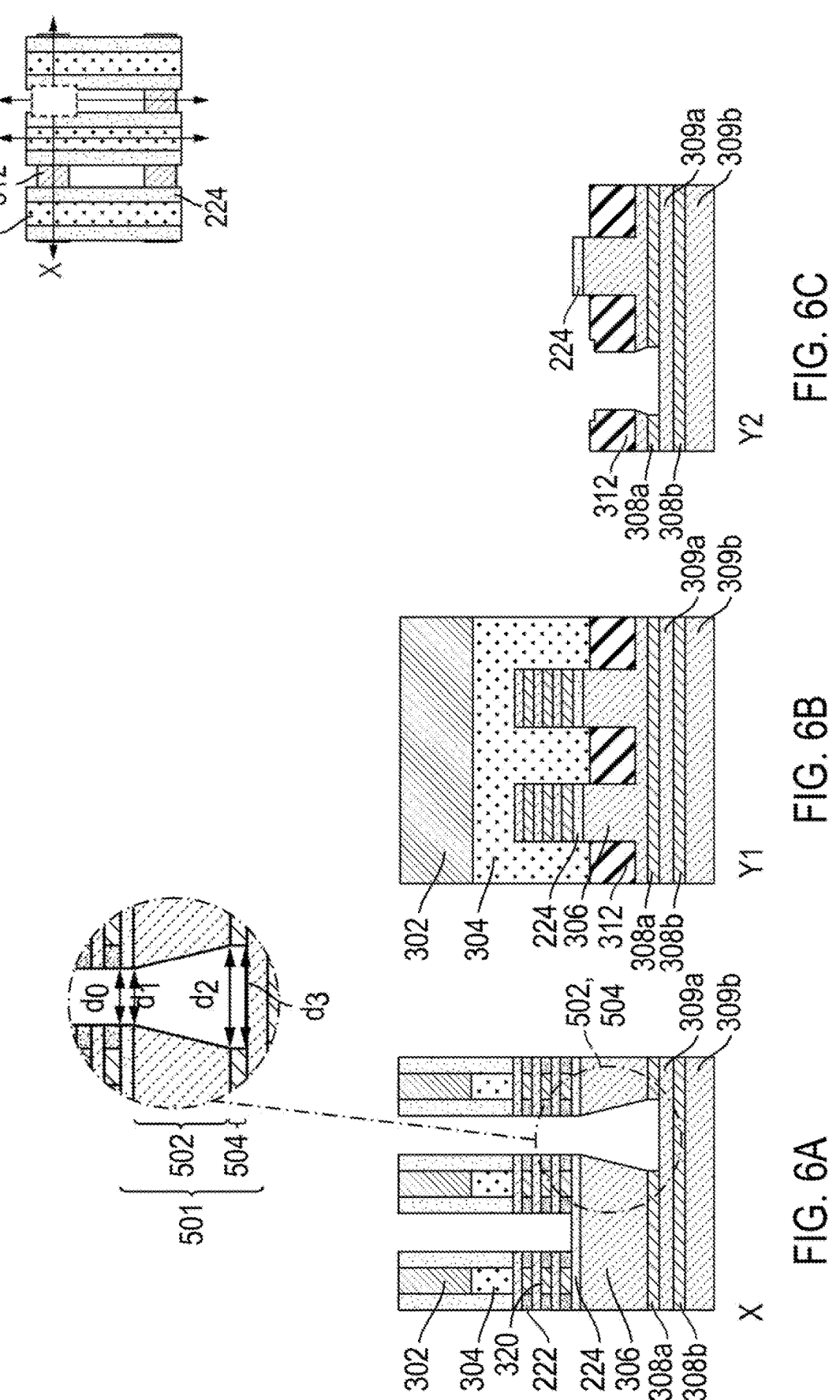

FIGS. 6A-6C depict forming a first cylindrical-shaped portion of the backside contact area in the first double-etch stop layer 308a, according to an example embodiment of the present disclosure. More specifically, by further etching in the first opening 401a shown in FIG. 4A, of first truncated-cone shaped portion 502, of sacrificial substrate 306, a first cylindrical-shaped portion 504 is formed by etching through the first-etch stopped layer 308a. The first cylindrical-shaped portion 504 is also referred to herein as the "second portion" 504. A portion of the sacrificial substrate 306 is revealed when the etching process to form first cylindrical-shaped portion 504 is complete. The etching away of this etch stop layer 308a may use a different process (with different selectivity) from the etching of the first portion 502; the etching away of etch stop layer 308a may result in non-sloped sidewalls. The first cylindrical shaped portion 504 may have a cylindrical shape having a third diameter, $d_3$, and no slope. As discussed previously, no slope as used herein, is defined as the third diameter being substantially constant, in this example equal to the second diameter, $d_2$ of the first truncated-cone shaped portion 502. In some embodiments, the size of $d_3$ may be dependent on the side of $d_2$, the size of $d_2$ may be dependent on the size of $d_1$, the size of $d_1$ may be dependent on the size of do, and the size of do may be dependent on the diameter of the source/drain region 216b. In general, however, as explained previously, $d_2$ is larger than $d_1$.

Figures 7A, 7B, 7C:
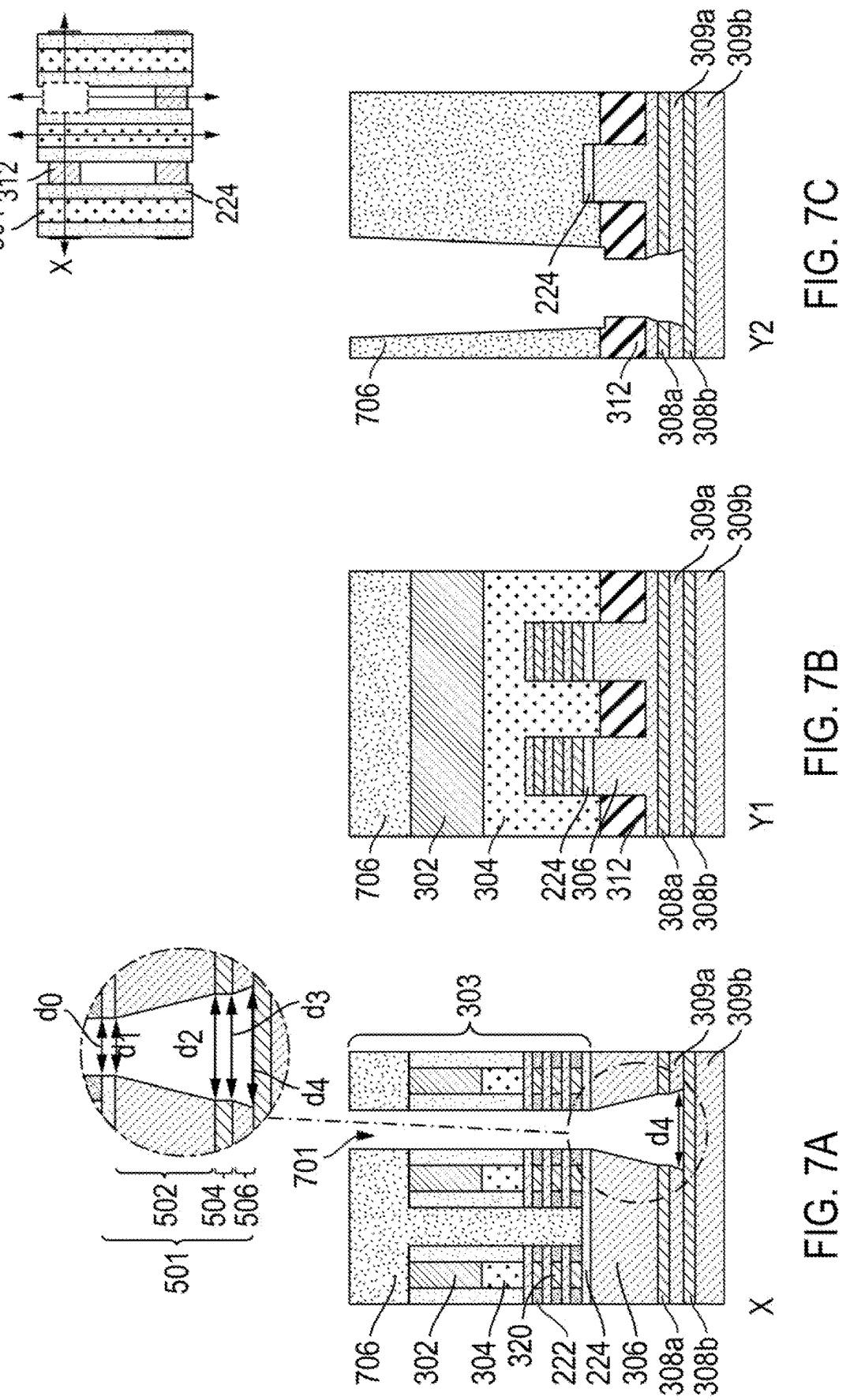

FIGS. 7A-7C depict forming a second truncated-cone shaped portion of the backside contact area 210 of FIG. 2, according to an example embodiment of the present disclosure. More specifically, after etching out the first cylindrical portion 504, a portion of sacrificial substrate 306 is revealed. Using similar etching conditions to those producing the first truncated-conical portion 502, a second truncated conical portion 506 below and adjacent to the first cylindrical-shaped portion 504 is created.

It is important to note that the backside contact structure 210 may have a repeating pattern of layers comprised of truncated cone shaped portions similar to truncated cone shaped portion 502 and cylindrical shaped portion similar to 504, by using the disclosed techniques above on additional repeating layers of Si and SiGe respectively in the sacrificial substrate 306 (not shown).

The repeating pattern of layers may alternate between truncated cone-shaped portion 502 and conical shaped portion 504. Each truncated-cone shaped portion has two diameters, a first diameter (e.g., diameter $d_1$) closer to the BDI structure and a second diameter (e.g., diameter $d_2$) further away from the BDI structure. The second diameter of each preceding truncated-cone shaped portion after the first truncated-cone shaped portion has a wider second diameter than the second diameter of the preceding truncated-cone shaped layer. For example, as shown in FIG. 7A, the second diameter, $d_4$ of second truncated-cone shaped portion 506 is wider than the second diameter, $d_2$ of first truncated-cone shaped portion 502. In some embodiments, the truncated cone-shaped portion may resemble the shape of a trapezoid when viewed from the side.

Figures 8A, 8B, 8C:
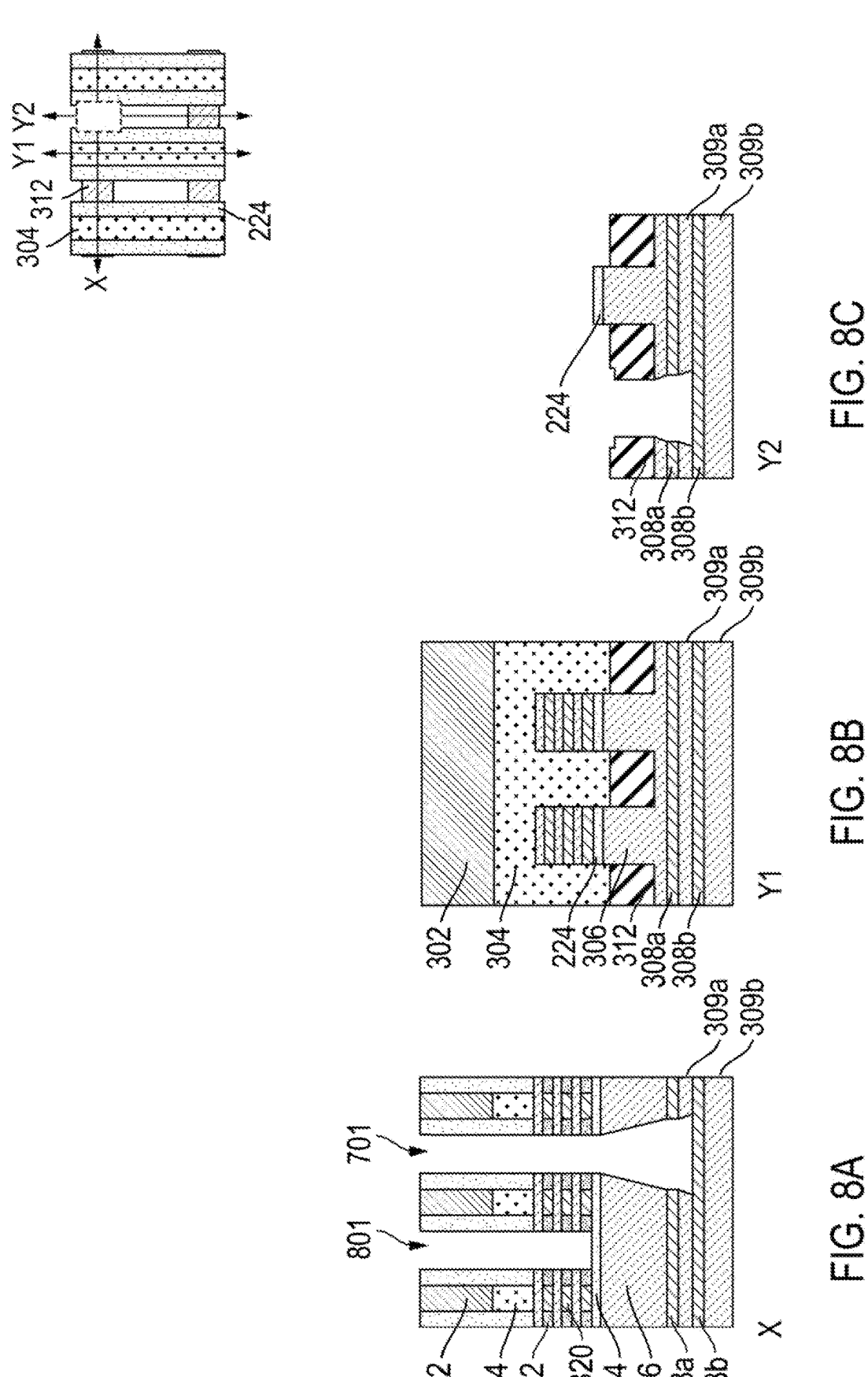

Returning now to forming the second truncated-cone shaped portion 506, a second OPL structure 706 is deposited on the intermediate structure 303 of FIGS. 7A-7C. By further etching down (e.g., reactive ion etching (RIE)) in the first cylindrical shaped portion 504 a second truncated-cone shaped portion 506 is formed above the second etch stop layer 308b, within opening 701 and below the first etch stop layer 308a. Once the second truncated cone-shaped portion 506 is formed, the second OPL structure 706 may be removed as shown in FIGS. 8A-8C.

Figures 9A, 9B, 9C:
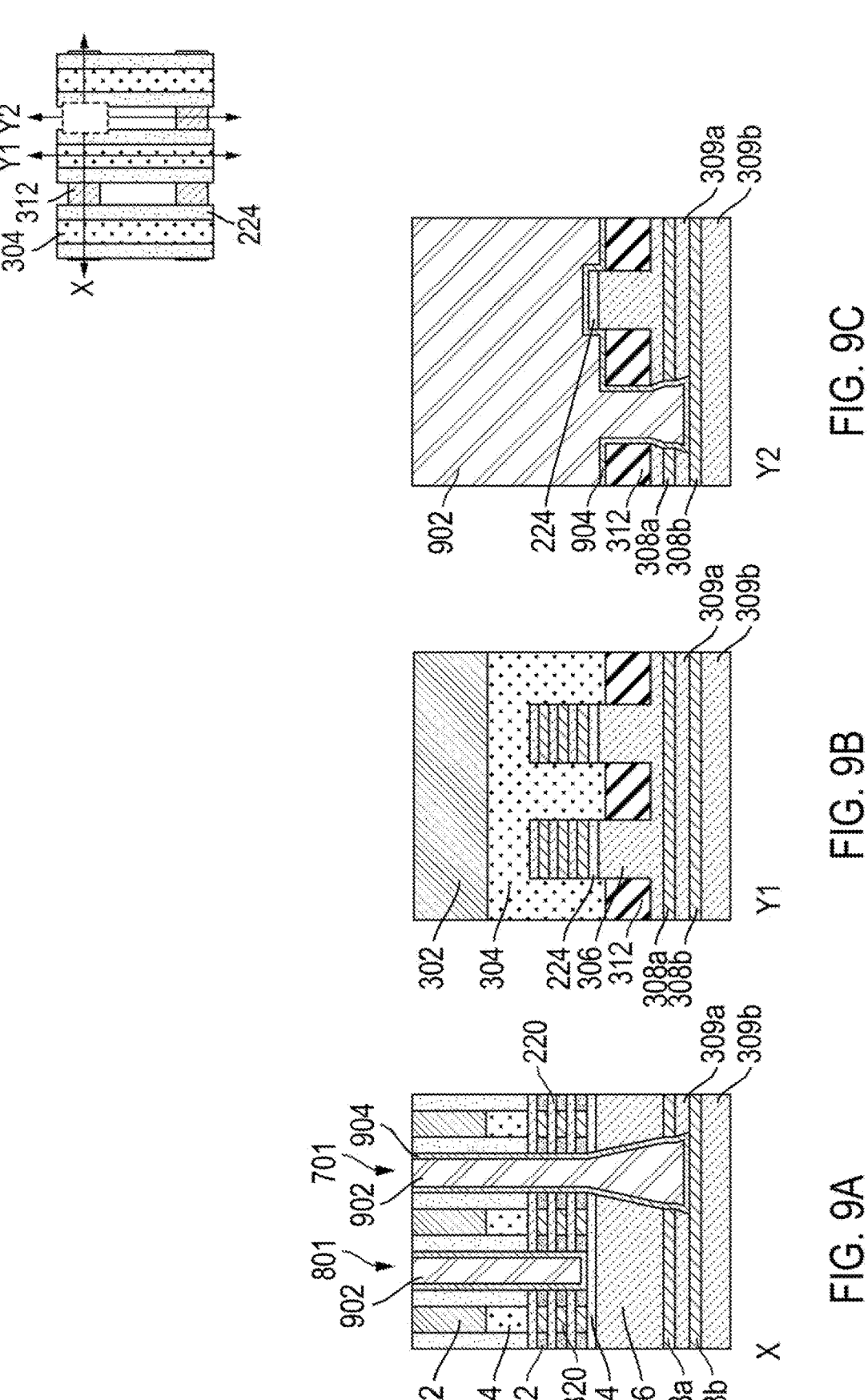

FIGS. 9A-9C depict SiN and flowable $SiO_2$ deposition, according to an example embodiment of the present disclosure. A protection layer 904 may be formed at first opening 801 and second opening 701. The protection layer 904 may be formed by depositing SiN through, for example, atomic layer deposition (ALD), in first opening 801 and second opening 701 (between the channel structures obtained by the removal of the $2^{nd}$ OPL structure in FIG. 8A). After the protection layer 904 is formed, flowable sacrificial material 902 (e.g., $SiO_2$) may be deposited in the openings 801 and 701a. In some embodiments, the protection layer 904 contacts the $2^{nd}$ etch stop layer 908b in the substrate.

Figures 10A, 10B, 10C:
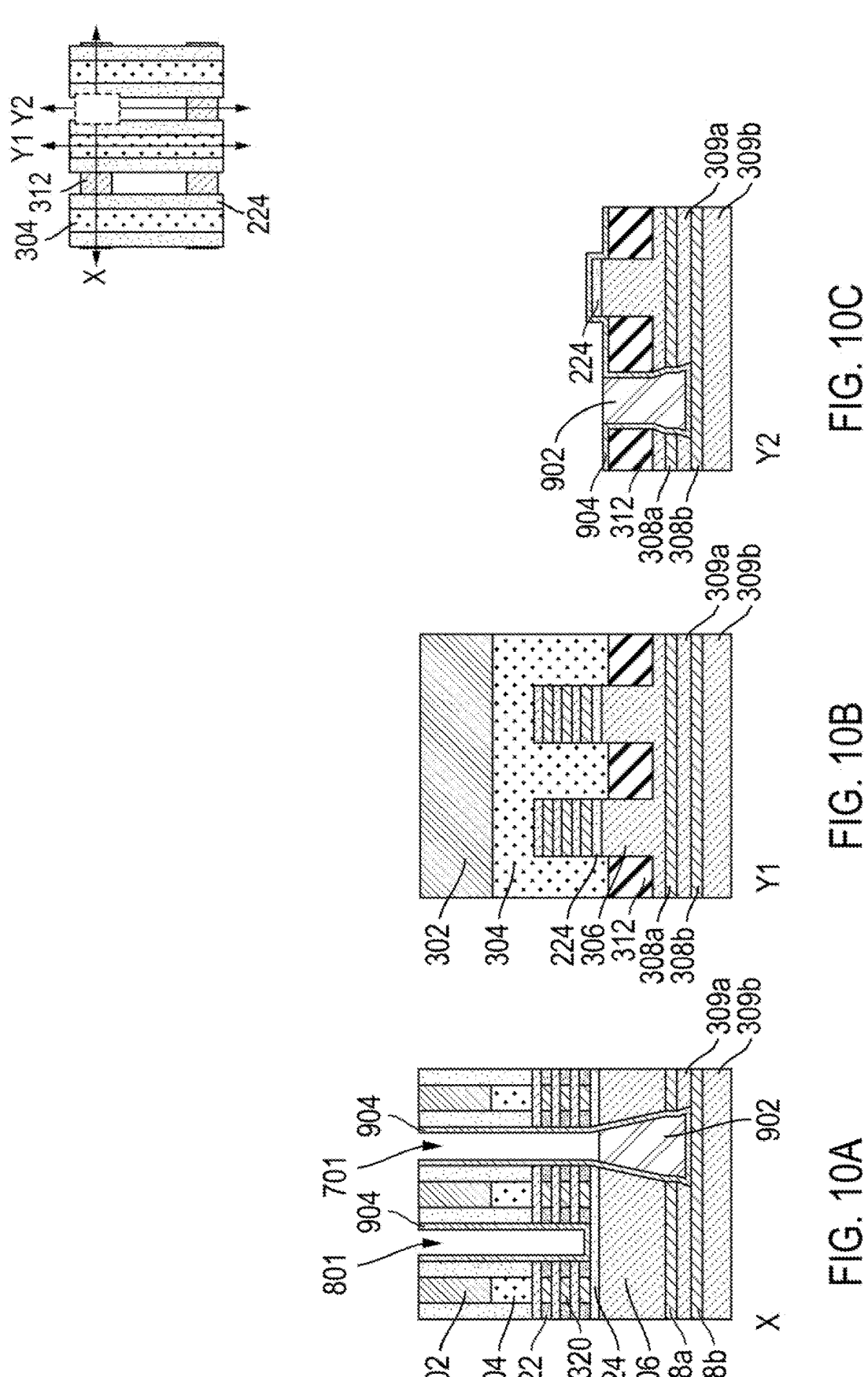

FIGS. 10A-10C illustrate removing flowable sacrificial material 902 to a predetermined depth, according to an example embodiment of the present disclosure. The flowable sacrificial material 902 may be removed down to and past the bottom surface of the BDI structure 224, exposing the protective layer 904. In some embodiments, removal is stopped at this depth by wet etch time.

Figures 11A, 11B, 11C:
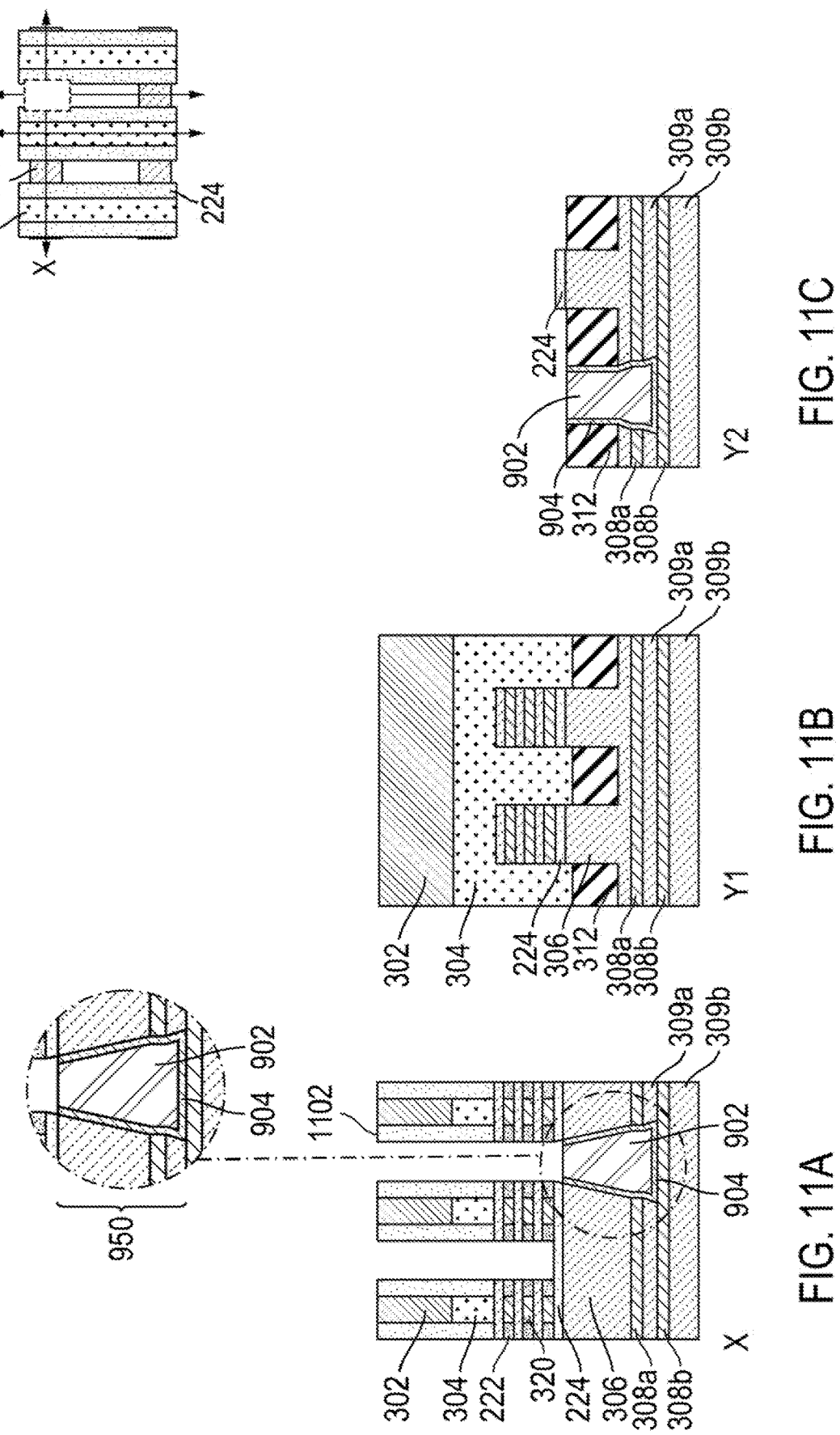

FIGS. 11A-11C depict an exposed liner etch, according to an example embodiment of the present disclosure. The protection layer 904 may be removed in openings 801 and 801b, down to and past the bottom surface of the BDI structure 224, exposing the liner 1102 of intermediate structure 303, except a portion remaining on the sacrificial material in the substrate 306. The liner 1102 may be a SiN-based liner and may only cover a portion of the side-hole. The removal of the flowable sacrificial material 902 (as depicted in at least FIG. 10A) and the removal of protection layer 904 as shown in at least FIG. 11A, down to and past the bottom surface of the BDI structure 224, forms a sacrificial buried contact 950.

FIGS. 12A-12C depict source/drain epi-growth, according to an example embodiment of the present disclosure. More specifically, source/drain structures 216a-b may be formed. For example, first source/drain region structure 216a is formed over the BDI structure 224. Second source/drain region structure 216b is formed over the remaining protective layer 904 and sacrificial material 902.

FIGS. 13A-13C depict ILD deposition, according to an example embodiment of the present disclosure. For example a first interlayer dielectric (ILD) structure 212 is formed on the source/drain region structures 216a-216b.

Figures 14A, 14B, 14C:
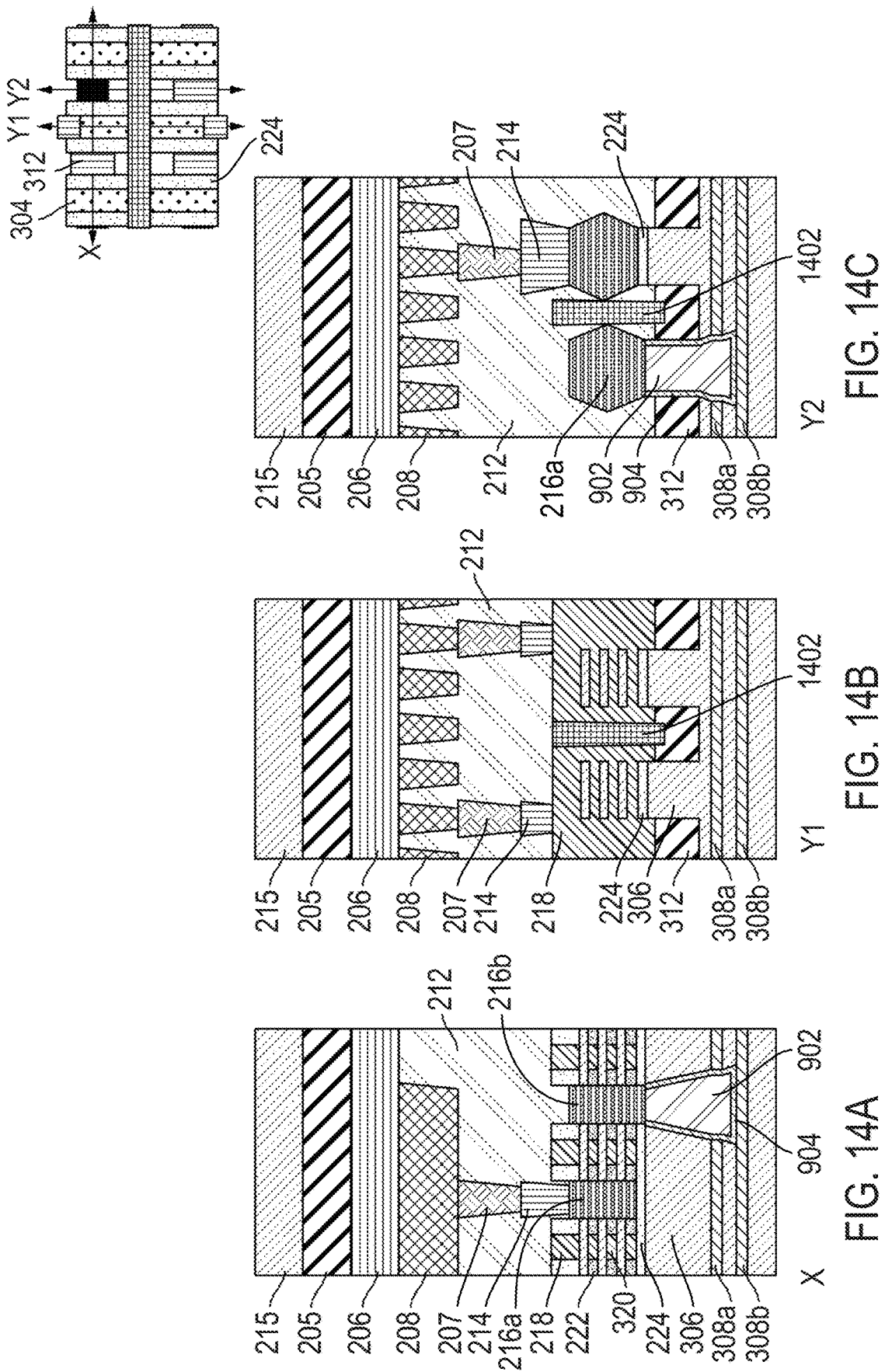

FIGS. 14A-14C depict MOL, BEOL, and carrier wafer formation, according to an example embodiment of the present disclosure. However, before carrier wafer 202 is formed over bonding oxide 205, several processing steps may occur that are omitted for brevity in the figures. These processing steps may include, for example, removal of dummy gate structure 304 and sacrificial Si layer 320. After removal of dummy gate structure 304 and sacrificial Si layer 320, a high-k metal gate (HKMG) structure 218 is formed in the opening, in place of the dummy gate structure 304 and sacrificial Si layer 320. An additional photolithography step (as depicted earlier in FIGS. 4A-4C) is performed. Gate cut structure 1402 with dielectric metal fill is formed. A second layer ILD 213 deposition in the intermediate structure is formed. Middle-of-line (MOL) structures 214 are formed thereon through the second ILD structure 212. Via 210 is formed over MOL structures 214. Metal line structures 208 are formed over via structures 210. BEOL structure 206 is formed over metal line structures 208. Finally, a carrier wafer 202 is bonded above the BEOL structures 206 using a bonding oxide 204.

Figures 15A, 15B, 15C:
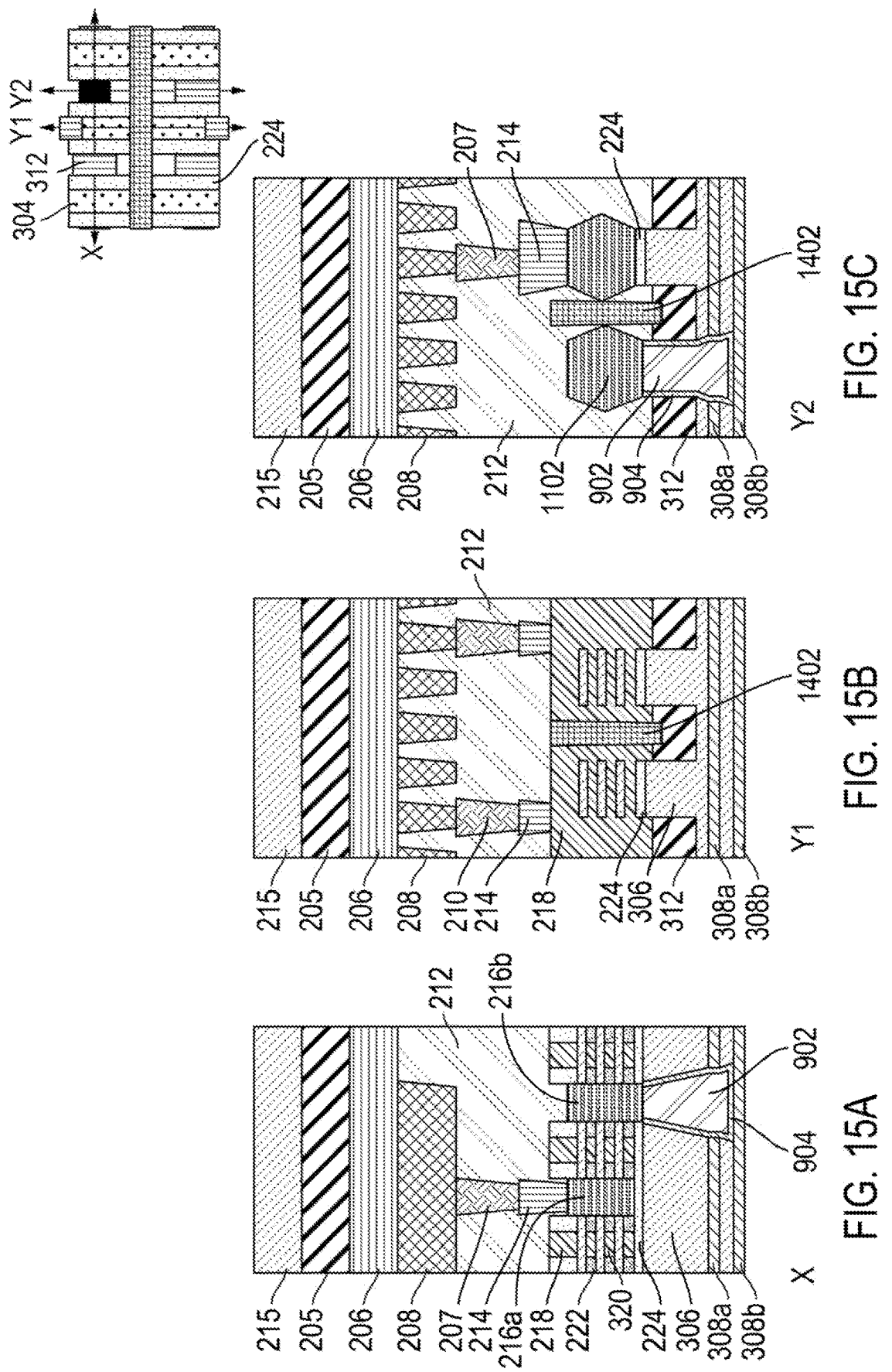

FIGS. 15A-15C depict etching away the sacrificial substrate, according to an example embodiment of the present disclosure. More specifically, the sacrificial substrate 306 is etched away until the etch stop layer 308b.

Figures 16A, 16B, 16C:
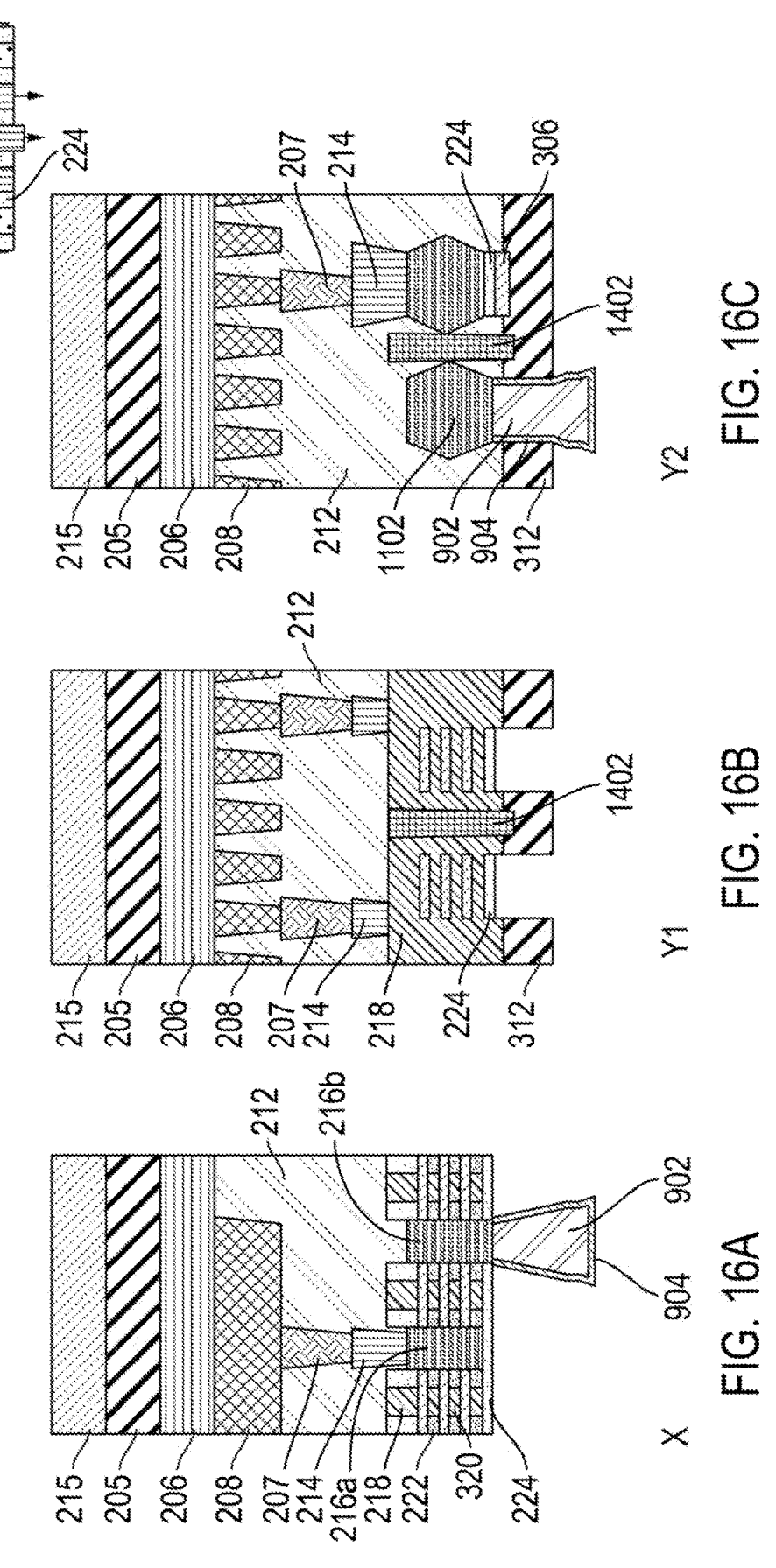

FIGS. 16A-16C depict double etch-stop layer and sacrificial substrate removal, according to an example embodiment of the present disclosure. At an intermediate step between FIG. 15A and FIG. 16C, the etch stop layer is removed, exposing the sacrificial silicon substrate 306 and the preliminary contact structure. This intermediate step is omitted for brevity. At FIG. 16A, any remaining silicon layers and etch stop layers used in producing the contact structure are removed, etching all the way down to the BDI 224. In alternative embodiments, it may be possible to form the final BSCA 210 at this phase, rather than later in FIG. 19A, as it is exposed. Moving more specifically to FIGS. 16A-16C, double etch-stop layers 308 a-b and sacrificial substrate 306 are removed from the semiconductor device.

Figures 17A, 17B, 17C:
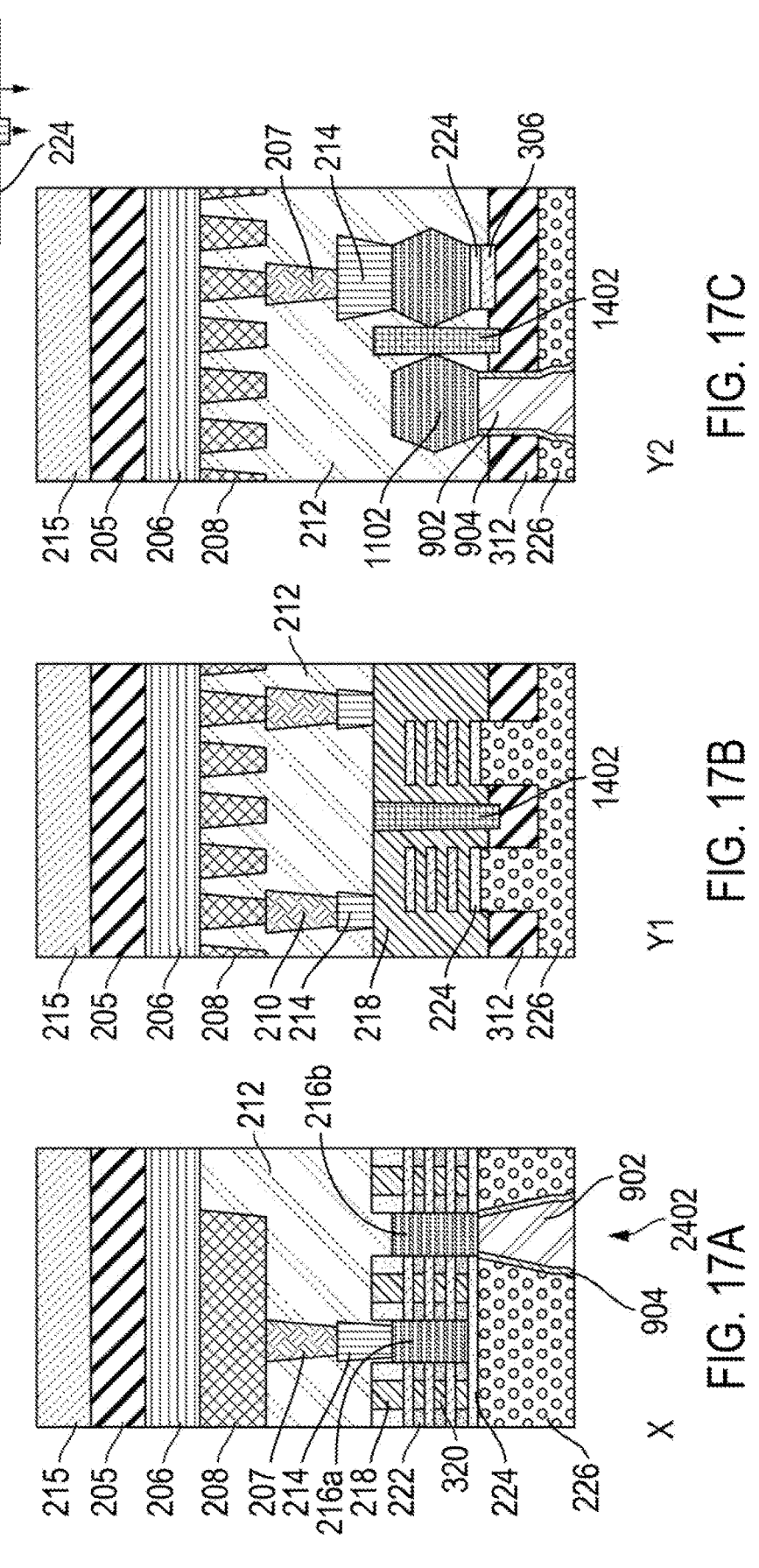

FIGS. 17A-17C depict substrate deposition, according to an example embodiment of the present disclosure. Low k-based ILD substrate 226) is deposited on BDI structure 224 and around the protection layer 904. The low k-based ILD substrate may be a Si-based substrate.

Figures 18A, 18B, 18C:
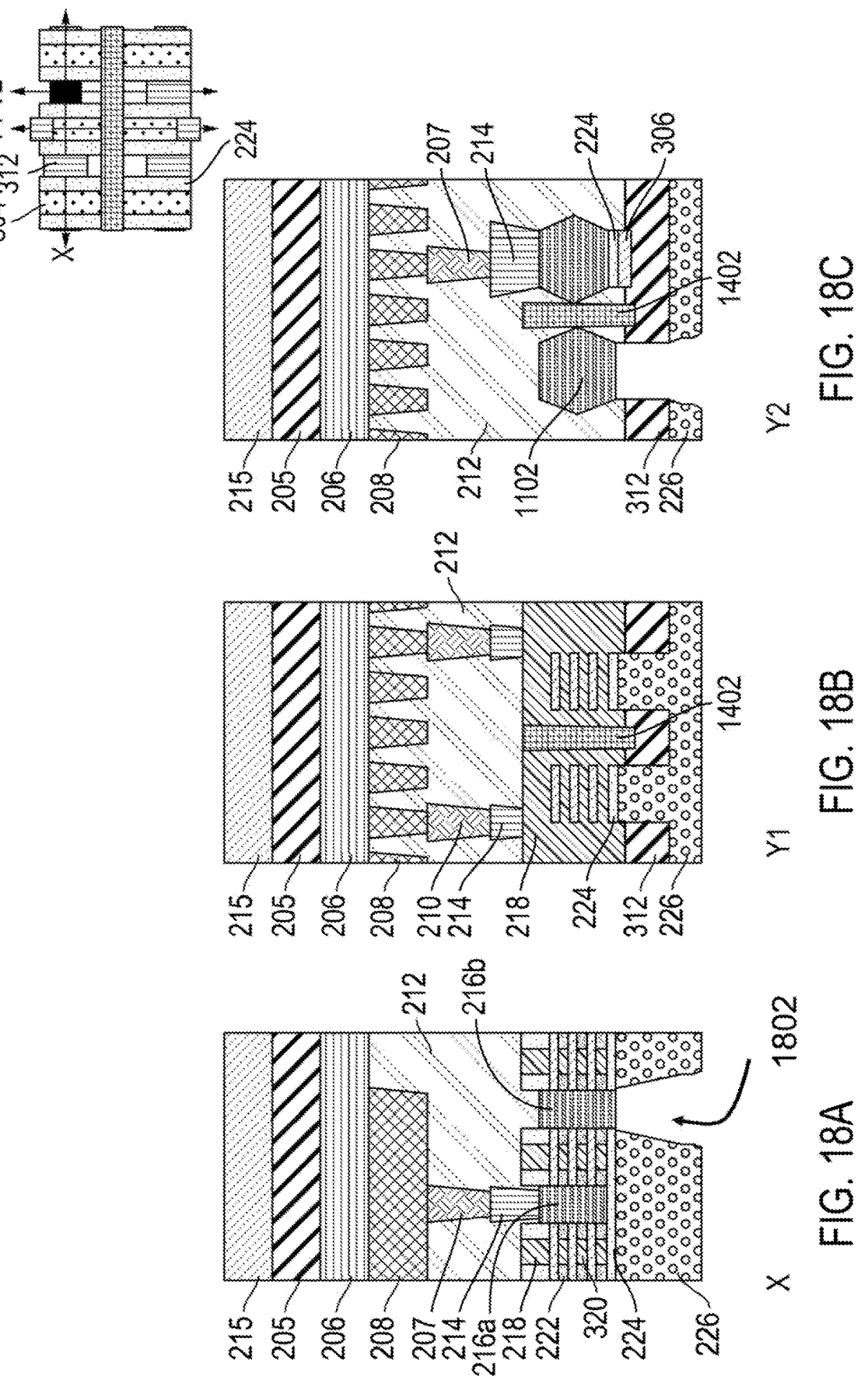
Figures 19A, 19B, 19C:
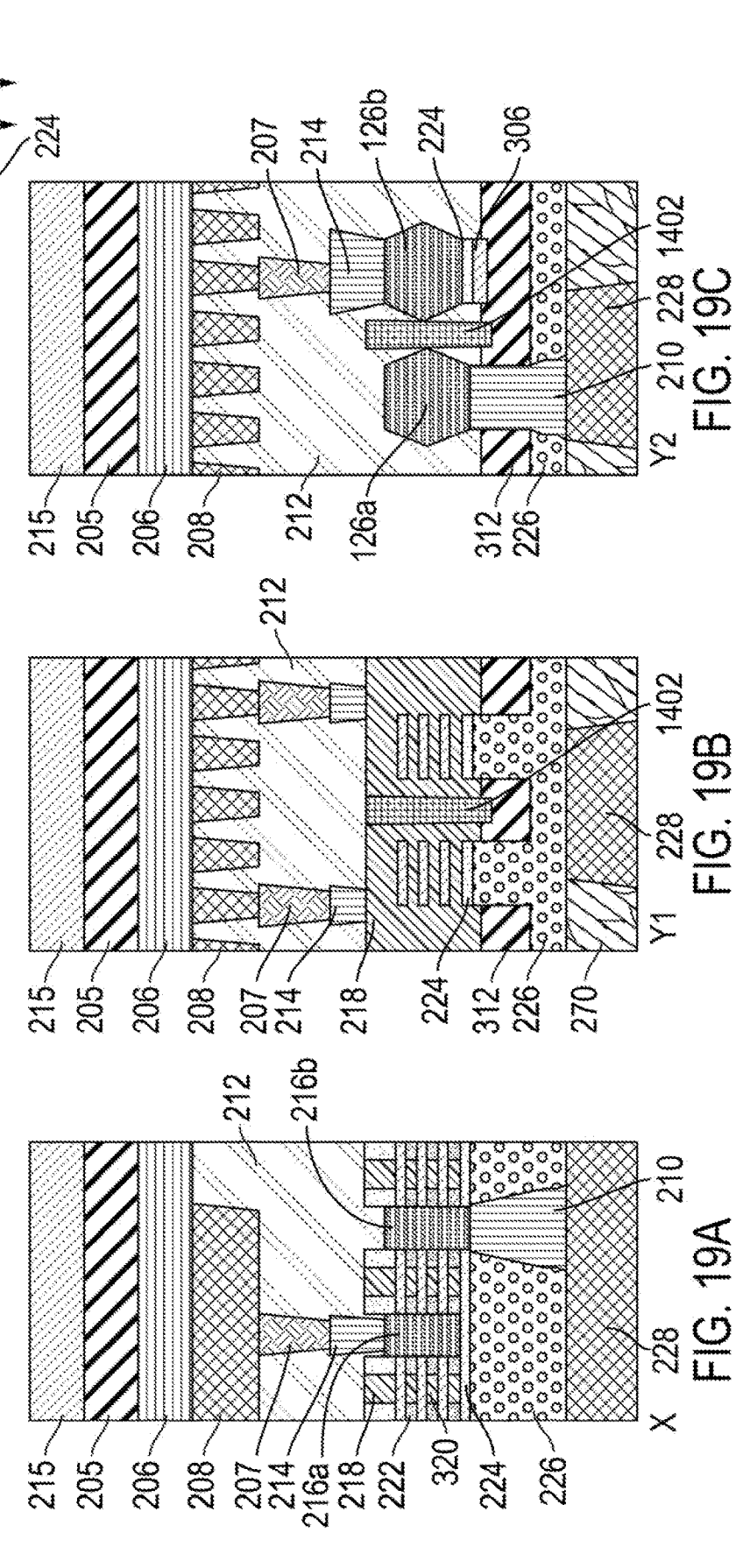

FIGS. 18A-18C depict $SiO_2$ and SiN removal, according to an example embodiment of the present disclosure. As shown here, flowable sacrificial material 902 and protection layer 904 are removed, producing a sacrificial placeholder hold 1802. The resulting hole produced may have similar or identical geometrical characteristics as the FIGS. 19A-19C depict BSCA formation, according to an example embodiment of the present disclosure. The hole produced in FIG. 18 is filled, via metal deposition, with a contact metal. The BSCA 210 also referred to herein as backside contact structure 210 is formed in a space obtained by the removal of the remaining sacrificial material 902 and protection layer 904. After the backside contact structure 210 is formed, a backside power rail 228 is formed thereon. [Engineers: What is element 270 in FIG. 19B?]

Figure 20C:
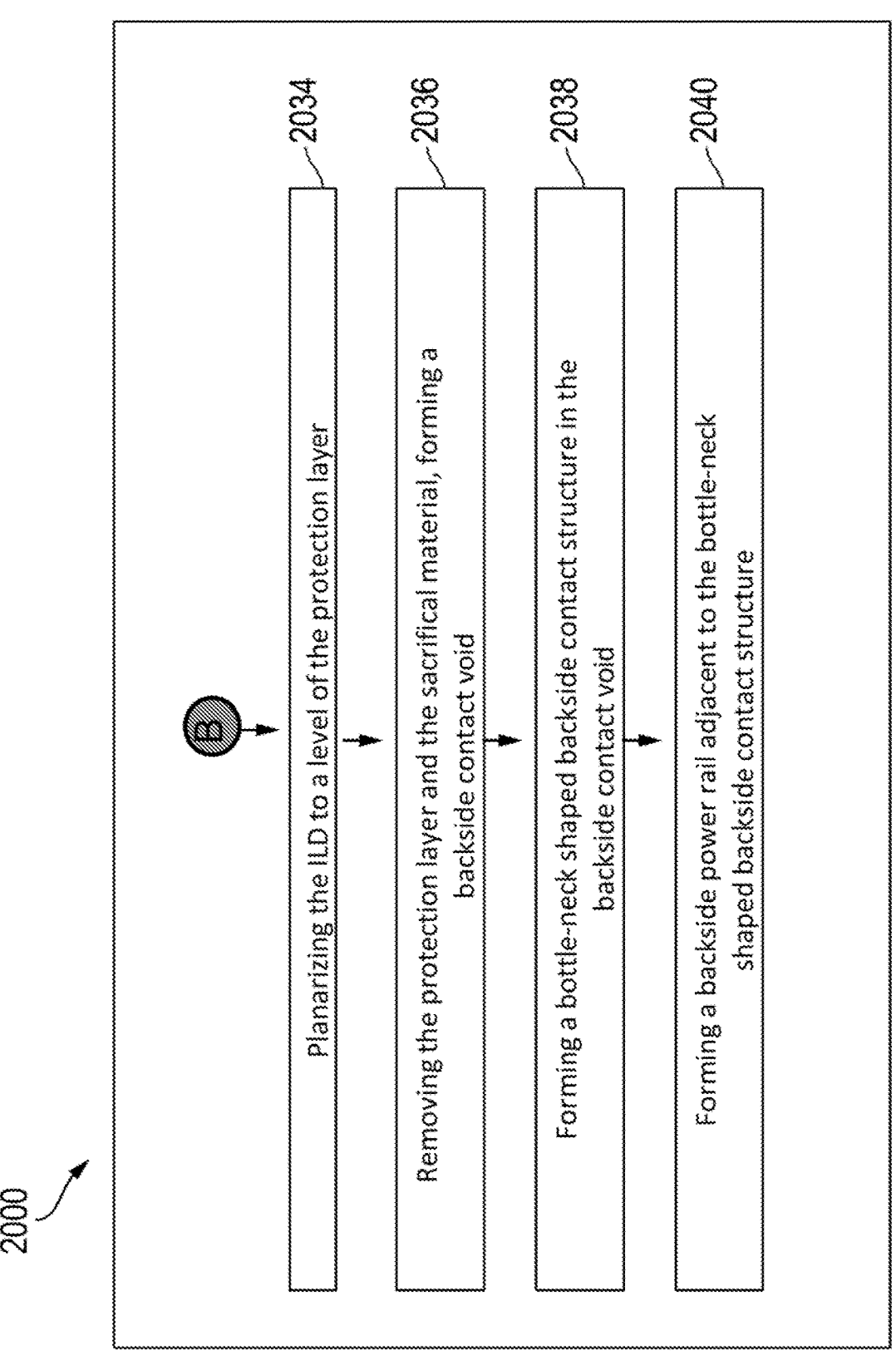

FIGS. 20A-20C are flowcharts for a process for forming a backside contact structure shown in FIG. 2, according to an example embodiment of the present disclosure. It is important to note that FIGS. 3A-19C, depict intermediate structures according to the steps of FIG. 20A-20C, as will be described in more detail, with reference to the Figures below.

The method 2000 for forming the backside contact structure (e.g., backside contact structure 210 shown in at least FIGS. 2 and 19A) may include various operations illustrated in at least FIGS. 20A-20C. In some embodiments, these operations (e.g., forming 2001, providing 2002, forming 2010, etc.) are not limited to the order described herein.

The method of forming 2001 is illustrated visually in at least FIG. 2A-2C. For example, as shown in FIG. 2A, the method 2000 may include forming 2001 a semiconductor device (e.g., semiconductor device 201 in FIG. 2). Forming 2001 a semiconductor device 201 may include forming a semiconductor device having two sides on a substrate, a first side and an opposite side. The semiconductor device 201 has one or more source/drain structures (e.g., source/drain structures 216a-b), one or more channel structures 220 and the substrate 226 is on a first side of the semiconductor device.

The method 2000 which includes forming 2002 and forming 2004, is illustrated visually in at least FIG. 2. Specifically, the method 2000 includes forming 2002 back-end-of-line (BEOL) layers 206 comprising a plurality of metal layers 208 disposed on the opposite side of the semiconductor device 201 from the substrate 226. Forming 2004 includes forming a bottle-neck shaped backside contact structure 210 in the substrate 226 and in contact with the source/drain structure 216a-b of the semiconductor device 201. For example, as shown in FIG. 2, the bottle-neck shaped backside contact structure 226 has a first side contacting the source/drain structure 216b, a second side contacting a backside power rail 228, and sidewalls extending from the source/drain structure 216*a-b* to the backside power rail 228. Importantly, the bottle-neck shaped backside contact structure 210 has a first region 202 having a positive slope and a second region 204 adjacent to the first region 202, having no slope. Forming 2004 a bottle-neck shaped backside contact structure 210 may include providing 2005 one or more etch stop layers (e.g., first etch stop layer 308*a* and second etch-stop layer 308*b*) in a sacrificial substrate (e.g., sacrificial substrate 306) beneath the semiconductor device, as illustrated visually in at least FIG. 2A.

The method 2000 which includes providing operation 2006 is illustrated visually in at least FIGS. 3A and 7A. Specifically, the method 2000 further includes providing 2006 a contact placeholder hole (e.g., first portion 502, second portion 504, third portion 506 shown in FIG. 7A). The contact placeholder hole may connect the BPR 228 to a source/drain region. More specifically, the contact placeholder hole may include a first portion (e.g., first portion 502) having a positive slope. The contact placeholder hole may also include a second portion (e.g., second portion 504) adjacent to the first portion 502 having no slope and extending from the first portion 502 to a distance further distal from the first portion 502. The contact placeholder hole may also include third portion 506 adjacent to the second portion 504 having a positive slope and extending from the second portion 504 to a distance further distal from the first portion 502.

The method 2000 which includes operations 2008 and 2010, is depicted in at least FIG. 4A. More specifically, in performing operation 2008, on the semiconductor device 201 and the sacrificial substrate 306, a mask and etch operation 2008 is used to prepare a final mask for an opening-forming operation 2010, which is shown in FIG. 5*a-c*. In operation 2010, a first opening area (e.g., opening area 401*a*) above and vertically aligned with the position of a source drain region and extending to a first etch-stop layer (e.g., first-etch stop layer 308*a*) of the sacrificial substrate (e.g., sacrificial substrate 306) is formed.

The method 2000 which includes further etching operation 2012 is illustrated visually in at least FIG. 5A. Specifically, the further etching 2012 in the first opening area (e.g., opening area 401A shown in FIG. 4A) proceeds to the first etch-stop layer 308*a*.

The method 2000 which includes further etching operation 2014 is illustrated visually in at least FIGS. 5A-7C. More specifically, in the first opening area, the first etch stop layer 308*a* is etched away (FIG. 6*a-c*), then the exposed sacrificial Si layer 309*a* is further etched to reveal a second etch-stop layer 308*b* (FIG. 7*a-c*)), forming opening 701.

The method 2000 which includes forming operation 2016 and depositing operation 2018 is illustrated visually in at least FIG. 9A. More specifically, a protection layer (e.g., protection layer 904) is formed in the opening 701 and a sacrificial material is deposited (e.g., sacrificial material 902) in the opening 701 within the protection layer The method 2000 which includes forming operation 2020 is illustrated visually in at least FIG. 12A-12C. More specifically source/drain region structures 216*a-b* are formed vertically aligned with the first opening.

The method 2000 which includes forming operation 2022 is illustrated visually in at least FIG. 13A-c. More specifically, an ILD structure (e.g., ILD structure 212) is formed around and above the semiconductor device, opposite the contact placeholder hole (e.g., contact placeholder hole 501).

The method 2000 which includes forming operation 2024 is illustrated visually in at least FIG. 14A. More specifically, middle-of-line (MOL) structures including ILD 212, contact plug 214, and first via structures 207 are formed thereon through the MOL ILD 212 structure and opposite the contact placeholder hole.

The method 2000 which includes forming operation 2026 is illustrated visually in at least FIG. 14A-C. More specifically, first metal line structures 208 are formed, connected to the first via structures 207.

The method 2000 which further includes forming operation 2028 is illustrated visually in at least FIG. 14A-C. More specifically, additional BEOL 206 structures on the first metal line structures 208 are formed.

The method 2000 which further includes flipping operation 2030 is illustrated visually in at least FIGS. 15A and 16A. As shown, the wafer is flipped, allowing processing on the (former) bottom side of the wafer including the removal of sacrificial substrate 306.

The method 2000 which further includes forming operation 2032 is illustrated visually in at least FIG. 17A. As shown, a second ILD structure 226 is formed on the semiconductor device and surrounding the protection layer (e.g., protection layer 904), opposite the MOL 212 and BEOL structures 206, in a space obtained from the removal of the sacrificial substrate 306. The second ILD structure 226 is also referred to herein as substrate 226.

The method 2000 which further includes planarizing operation 2034 is illustrated visually in at least FIG. 17A. More specifically, the ILD structure 226 is planarized to a level of the protection layer 904.

The method 2000 which further includes removing operation 2036 is illustrated visually in at least FIG. 18A. Specifically, the protection layer 904 and the sacrificial material 902 are removed, forming a backside contact void (e.g., backside contact void 1802).

The method 2000 which further includes forming operation 2038 is illustrated visually in at least FIG. 19A. Specifically, a bottle-neck shaped backside contact structure 210 is formed in the backside contact void 1802 by metal deposition.

The method 2000 of which further includes forming operation 2040 is illustrated visually in at least FIG. 19A. More specifically, a backside power rail 228 adjacent to the bottle-neck shaped backside contact structure 210 is formed.

Figure 21:
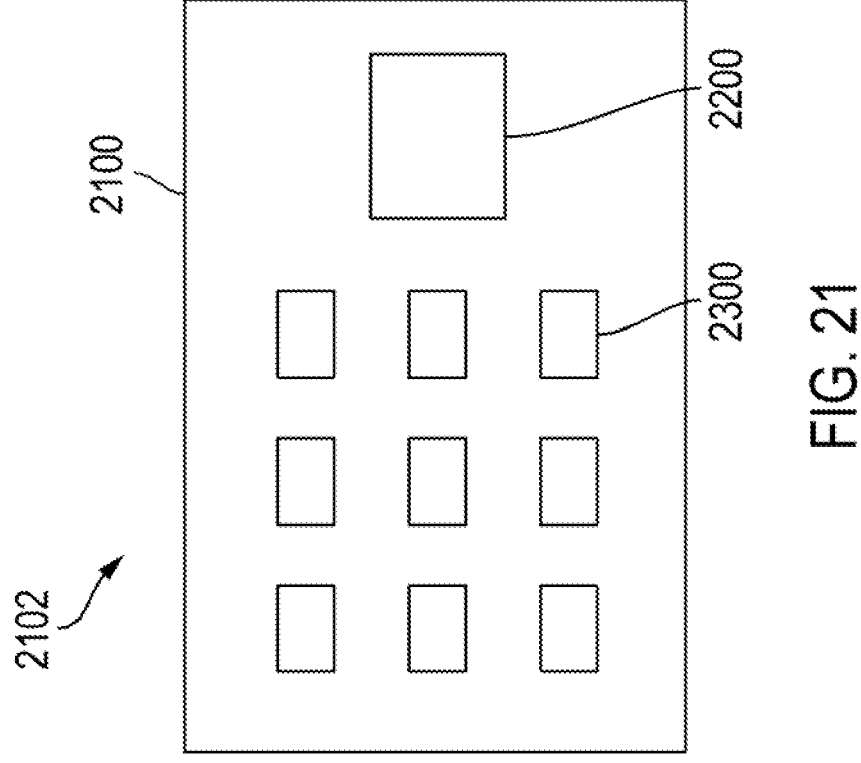
FIG. 21 depicts a semiconductor package, according to an example embodiment of the present disclosure.

FIG. 21 depicts a semiconductor package 2102 according to an example embodiment of the present disclosure. The semiconductor package 2102 may include a processor 2200 and semiconductor units 2300 that are mounted on a substrate 2100. The processor 2200 and/or the semiconductor units 2300 may include one or more of the semiconductor devices 300 of FIG. 3 described above.

Figure 22:
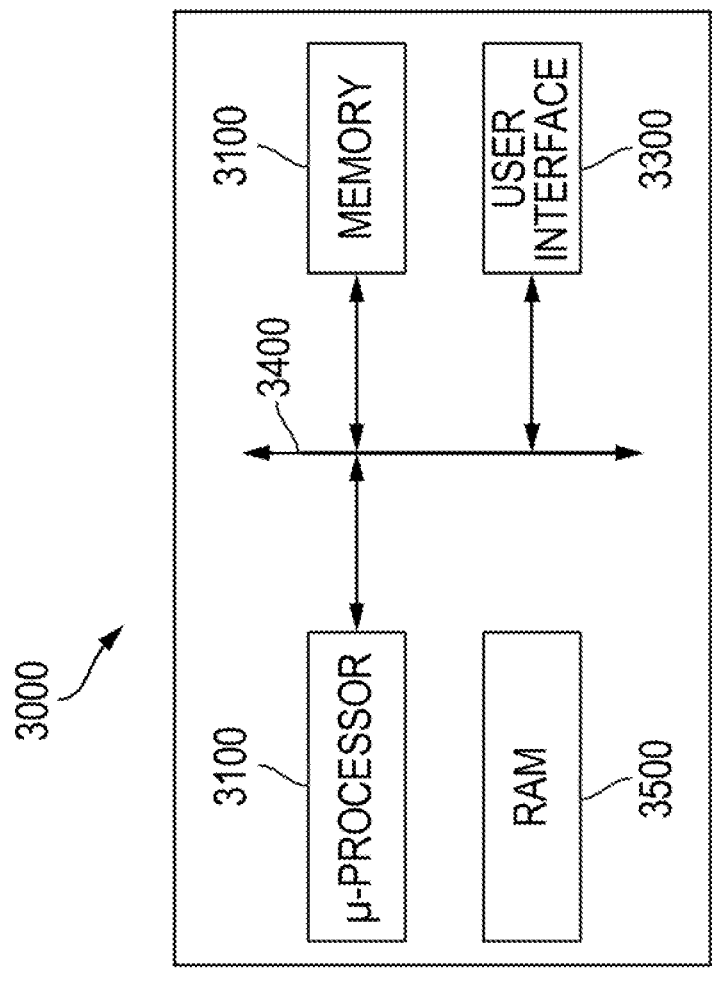
FIG. 22 depicts a schematic block diagram of an electronic system, according to an example embodiment of the present disclosure.

FIG. 22 depicts a schematic block diagram of an electronic system according to an example embodiment.

Referring to FIG. 22, an electronic system 3000 in accordance with an embodiment may include a microprocessor 3100, a memory 3200, and a user interface 3300 that perform data communication using a bus 3400. The microprocessor 3100 may include a central processing unit (CPU) or an application processor (AP). The electronic system 3000 may further include a random access memory (RAM) 3500 in direct communication with the microprocessor 3100. The microprocessor 3100 and/or the RAM 3500 may be implemented in a single module or package. The user interface 3300 may be used to input data to the electronic system 3000, or output data from the electronic system 3000. For example, the user interface 3300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 3200 may store operational codes of the microprocessor 3100, data processed by the microprocessor 3100, or data received from an external device. The memory 3200 may include a memory controller, a hard disk, or a solid state drive (SSD).

At least the microprocessor 3100, the memory 3200 and/or the RAM 3500 in the electronic system 3000 may be the semiconductor devices 201 of FIG. 2.

The embodiments described herein are all example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers and sacrificial layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper,", "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms $1^{st}$, $2^{nd}$, $3^{rd}$, $4^{th}$, etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements, structures or layer of semiconductor devices including a nanosheet transistor may or may not be described in detail herein. For example, an etch stop layer or a barrier metal pattern formed on or in a layer or structure of a semiconductor device may be omitted herein.

What is claimed is:

1. A device comprising:

a semiconductor device on a substrate, the semiconductor device having at least two sides and the semiconductor device including:

a bottom dielectric isolation;

a channel structure and a gate at least partially surrounding the channel structure;

a plurality of source/drain structures on opposing sides of the channel structure;

the substrate on a first side of the semiconductor device, the substrate including:

a backside power rail (BPR);

a backside contact structure, the backside contact structure vertically between the backside power rail and a first source/drain structure, wherein the backside contact structure comprises a first portion contacting the first source/drain structure, having a positive slope, wherein the backside contact structure further comprises a second portion adjacent to the first portion having no slope, extending from the first portion to a distance further distal from the first source/drain structure; and one or more metal signal routing layers disposed on an opposite side of the semiconductor device than the substrate, wherein the first portion has a first truncated-cone shaped structure, comprising a first diameter proximate the first source/drain structure and a second diameter distal from the first source/drain structure and wherein the positive slope is defined as the second diameter being greater than the first diameter.

2. The device of claim 1, wherein the second portion has a conical shaped structure having a third diameter, and wherein no slope is defined as the third diameter being substantially constant and equal to the second diameter.

3. The device of claim 1, wherein the backside contact structure has a repeating pattern of layers comprised of the first portion being a first layer, the second portion being a second layer, wherein each subsequent truncated-cone shaped structure after the first truncated-cone shaped structure has a wider second diameter than a preceding truncated-cone shaped portion.

4. The device of claim 1, wherein the backside contact structure is configured to have a bottle-neck-shaped geometry with a mean diameter increase.

5. The device of claim 1, wherein the backside contact structure includes an initial portion preceding the first portion, wherein the initial portion has a cylindrical shaped structure and wherein the initial portion has side-walls that contact the bottom dielectric isolation.

6. The device of claim 5, wherein the initial portion has at least two sides, a first side facing the metal signal routing layers and a second side facing the backside power rail, wherein the first side contacts the first source/drain.

7. The device of claim 1, wherein the first portion has a trapezoid shaped structure from a side-view.

8. A method of manufacturing an integrated circuit device, the method comprising:

forming a semiconductor device having two sides on a substrate, a first side and an opposite side, wherein the semiconductor device has one or more source/drain structures, one or more channel structures and wherein the substrate is on the first side of the semiconductor device;

forming a back-end-of-line (BEOL) region comprising a plurality of metal layers, disposed on the opposite side of the semiconductor device from the substrate; and forming a bottle-neck shaped backside contact structure in the substrate and in contact with a first source/drain structure of the semiconductor device, wherein forming the bottle-neck shaped backside contact structure comprises forming a first opening above and vertically aligned with a position of the first source/drain structure and extending to a first etch-stop layer, wherein the bottle-neck shaped backside contact structure has a first side contacting the first source/drain structure, a second side contacting a backside power rail, and sidewalls extending from the first source/drain structure to the backside power rail; and wherein the backside contact structure has a first region having a positive slope and a second region, adjacent to the first region, having no slope.

9. The method of claim 8, wherein forming the bottle-neck shaped backside contact structure includes providing a contact placeholder hole connecting the backside power rail to the first source/drain structure, the contact placeholder hole having:

a first portion contacting the first source/drain structure, having a positive slope, a second portion adjacent to the first portion having no slope and extending from the first portion to a distance further distal from the first source/drain.

10. The method of claim 9, wherein forming the bottle-neck shaped backside contact structure further includes:

providing one or more etch stop layers comprising the first etch-stop layer on a sacrificial substrate;

performing, on the semiconductor device and the sacrificial substrate, a mask and etch operation; and forming the first opening above and vertically aligned with the position of the first source/drain structure and extending to the first etch-stop layer of the one or more etch stop layers on the sacrificial substrate.

11. The method of claim 10, further comprising:

further etching in the first opening, the first etch-stop layer to reveal the sacrificial substrate; and further etching in the first opening, the sacrificial substrate to reveal a second etch-stop layer.

12. The method of claim 11, further comprising:

forming a protection layer in the first opening;

depositing a sacrificial material in the first opening within the protection layer; and forming the first source/drain region structure vertically aligned with the first opening.

13. The method of claim 12, further comprising:

forming an ILD structure around and above the semiconductor device, opposite the contact placeholder hole.

14. The method of claim 13, further comprising:

forming a middle-of-line (MOL) structure and a first via structure thereon through the ILD structure and opposite the contact placeholder hole.

15. The method of claim 14, further comprising:

forming first metal line structures connected to the first via structures;

forming a back-end-of-line (BEOL) structure on the first metal line structures.

16. The method of claim 15, further comprising:

removing the sacrificial substrate including any remaining first etch stop layer and second etch stop layer, exposing the protection layer.

17. The method of claim 16, further comprising:

forming a second ILD structure on the semiconductor device and surrounding the protection layer, opposite the MOL and BEOL structures, in a space obtained from the removal of the sacrificial substrate.

18. The method of claim 17, further comprising:

planarizing the second ILD structure to a level of the protection layer; and removing the protection layer and the sacrificial material, forming a backside contact void.

19. The method of claim 18, further comprising:

forming a bottle-neck shaped backside contact structure in the backside contact void; and forming the backside power rail (BPR) adjacent to the bottle-neck shaped backside contact structure.

20. A device comprising:

a semiconductor device on a substrate, the semiconductor device having at least two sides and the semiconductor device including:

a bottom dielectric isolation;

a channel structure and a gate at least partially sur-rounding the channel structure;

a plurality of source/drain structures on opposing sides of the channel structure;

the substrate on a first side of the semiconductor device, the substrate including:

a backside power rail (BPR);

a backside contact structure, the backside contact struc-ture vertically between the backside power rail and a first source/drain structure, wherein the backside contact structure comprises a first portion contacting the first source/drain structure, having a positive slope, wherein the backside contact structure further com-prises a second portion adjacent to the first portion having no slope, extending from the first portion to a distance further distal from the first source/drain structure, and wherein the backside contact structure includes an initial portion between the first source/drain structure and the first portion, wherein the initial portion has a cylindrical shaped structure and wherein the initial portion has side-walls that contact the bottom dielec-tric isolation; and one or more metal signal routing layers disposed on an opposite side of the semiconductor device than the substrate.

* * * * *